(12) United States Patent
Kim et al.

(10) Patent No.: US 12,557,509 B2
(45) Date of Patent: Feb. 17, 2026

(54) DISPLAY PANEL AND DISPLAY APPARATUS INCLUDING THE SAME

(71) Applicant: SAMSUNG DISPLAY CO., LTD., Yongin-si (KR)

(72) Inventors: Kyungmin Kim, Yongin-si (KR); Junhyeong Park, Yongin-si (KR); Jaeun Lee, Yongin-si (KR); Jaemin Shin, Yongin-si (KR); Sangha Park, Yongin-si (KR); Dahee Jeong, Yongin-si (KR); Kyuhwan Hwang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 341 days.

(21) Appl. No.: 17/393,599

(22) Filed: Aug. 4, 2021

(65) Prior Publication Data

US 2022/0149118 A1    May 12, 2022

(30) Foreign Application Priority Data

Nov. 11, 2020    (KR) .......................... 10-2020-0150509

(51) Int. Cl.
*H10K 59/35*       (2023.01)
*G09G 3/3233*      (2016.01)
(Continued)

(52) U.S. Cl.
CPC ......... *H10K 59/353* (2023.02); *H10K 59/131* (2023.02); *H10K 59/352* (2023.02);
(Continued)

(58) Field of Classification Search
None
See application file for complete search history.

(56) References Cited

U.S. PATENT DOCUMENTS 9,484,391 B2     11/2016  Kwon
2007/0002084 A1*  1/2007  Kimura ............... G09G 3/3241
                                             345/694
(Continued)

FOREIGN PATENT DOCUMENTS

CN    108321183 A    7/2018
CN    108389879 A    8/2018
(Continued)

*Primary Examiner* — Erik T. K. Peterson
*Assistant Examiner* — Christopher A. Schodde
(74) *Attorney, Agent, or Firm* — CANTOR COLBURN LLP

(57) ABSTRACT

A display panel includes: a substrate including a main display area and a corner display area; a main pixel located in the main display area and including at least one first main sub-pixel, at least one second main sub-pixel, and at least one third main sub-pixel; and an auxiliary pixel located in the corner display area and including a first auxiliary sub-pixel, a second auxiliary sub-pixel, and a third auxiliary sub-pixel. The number of the at least one first main sub-pixel is greater than each of the number of the at least one second main sub-pixel and the number of the at least one third main sub-pixels, and the first auxiliary sub-pixel is located closer to the main display area than the second auxiliary sub-pixel and the third auxiliary sub-pixel.

17 Claims, 14 Drawing Sheets

(51) Int. Cl.
*G09G 3/3266* (2016.01)
*H10K 59/131* (2023.01)

(52) U.S. Cl.
CPC ......... *G09G 3/3233* (2013.01); *G09G 3/3266* (2013.01); *G09G 2300/0452* (2013.01); *G09G 2300/0842* (2013.01); *G09G 2310/0281* (2013.01); *G09G 2340/0407* (2013.01)

(56) References Cited

U.S. PATENT DOCUMENTS

| | | | | |
|---|---|---|---|---|
| 2010/0090620 | A1* | 4/2010 | Hack | H10K 59/351 257/40 |
| 2014/0139771 | A1* | 5/2014 | Choi | H10K 50/841 349/43 |
| 2014/0355195 | A1* | 12/2014 | Kee | G06F 1/1616 361/679.27 |
| 2015/0029683 | A1* | 1/2015 | Kim | H10K 77/111 361/749 |
| 2015/0102297 | A1 | 4/2015 | Lee | |
| 2015/0311265 | A1* | 10/2015 | Matsueda | H10K 59/353 257/89 |
| 2016/0013251 | A1* | 1/2016 | Yoshida | H10K 59/122 257/40 |
| 2016/0041424 | A1* | 2/2016 | Guo | H10K 59/351 345/694 |
| 2016/0104413 | A1* | 4/2016 | Matsueda | G09G 3/3225 345/694 |
| 2016/0126295 | A1 | 5/2016 | Sato | |
| 2016/0155416 | A1 | 6/2016 | Lee | |
| 2016/0155776 | A1* | 6/2016 | Kabe | H10K 59/353 257/89 |
| 2017/0121528 | A1* | 5/2017 | Kim | C08J 7/0427 |
| 2018/0211586 | A1 | 7/2018 | Shen et al. | |
| 2019/0074331 | A1* | 3/2019 | Oh | H10K 59/80515 |
| 2019/0130822 | A1* | 5/2019 | Jung | G09G 3/3208 |
| 2020/0075687 | A1* | 3/2020 | He | H10K 59/351 |
| 2020/0124927 | A1 | 4/2020 | Kim et al. | |
| 2020/0142449 | A1* | 5/2020 | Nakatogawa | G06F 1/1643 |
| 2020/0170126 | A1* | 5/2020 | Ahn | G06F 1/1637 |
| 2020/0176696 | A1 | 6/2020 | Dai | |
| 2020/0212127 | A1* | 7/2020 | Choi | H10K 77/111 |
| 2020/0394984 | A1* | 12/2020 | Park | G09G 5/373 |
| 2021/0065625 | A1* | 3/2021 | Wang | G09G 3/3233 |
| 2021/0376011 | A1* | 12/2021 | Liu | H10K 59/121 |
| 2022/0005881 | A1* | 1/2022 | Ma | H10K 59/353 |
| 2022/0037421 | A1* | 2/2022 | Park | H10K 59/121 |
| 2022/0069051 | A1* | 3/2022 | Lee | H10K 59/122 |

FOREIGN PATENT DOCUMENTS

| | | |
|---|---|---|
| CN | 110678983 | 1/2020 |
| EP | 3640716 A2 | 4/2020 |
| KR | 1020160053798 A | 5/2016 |
| KR | 1020190027986 A | 3/2019 |
| KR | 101991431 B1 | 6/2019 |
| KR | 1020200044245 A | 4/2020 |
| KR | 1020200063379 A | 6/2020 |
| KR | 1020200082971 A | 7/2020 |
| WO | 2020219267 A1 | 10/2020 |

\* cited by examiner

DISPLAY PANEL AND DISPLAY APPARATUS INCLUDING THE SAME

This application claims priority to Korean Patent Application No. 10-2020-0150509, filed on Nov. 11, 2020, and all the benefits accruing therefrom under 35 U.S.C. § 119, the content of which in its entirety is herein incorporated by reference.

BACKGROUND

1. Field

One or more embodiments relate to a display panel in which a display area for displaying an image is expanded, and a display apparatus including the display panel.

2. Description of Related Art

A mobility-based electronic device is widely used. Tablet personal computers ("PCs"), in addition to small electronic devices such as mobile phones, have been widely used as a mobile electronic device.

The mobile electronic device includes a display apparatus to provide various functions, for example, visual information such as images or video to a user. As sizes of other components for driving the display apparatus have decreased, the proportion occupied by the display apparatus in the electronic device has gradually increased, and a structure having two or more display areas that extend at a certain angle has been developed.

SUMMARY

One or more embodiments provide a display panel in which a luminance deviation and a color deviation at a boundary between a main display area and a corner display area including different pixel arrangements are reduced, and a display apparatus including the display panel. However, the embodiments are examples, and do not limit the scope of the disclosure.

Additional aspects will be set forth in part in the description which follows and, in part, will be apparent from the description, or may be learned by practice of the presented embodiments.

According to one or more embodiments, a display panel includes: a substrate including a main display area and a corner display area connected to a corner of the main display area; a main pixel located in the main display area and including at least one first main sub-pixel which emits light of a first wavelength band, at least one second main sub-pixel which emits light of a second wavelength band, and at least one third main sub-pixel which emits light of a third wavelength band; and an auxiliary pixel located in the corner display area and including a first auxiliary sub-pixel, a second auxiliary sub-pixel, and a third auxiliary sub-pixel. The number of the at least one first main sub-pixel included in the main pixel is greater than each of the number of the at least one second main sub-pixel and the number of the at least one third main sub-pixel, and the first auxiliary sub-pixel emits light of the first wavelength band, and is located closer to the main display area than the second auxiliary sub-pixel and the third auxiliary sub-pixel.

The first auxiliary sub-pixel may be located to face the main display area.

Each of the first auxiliary sub-pixel, the second auxiliary sub-pixel, and the third auxiliary sub-pixel may be a rectangular shape in a plan view.

A direction of a long side of the first auxiliary sub-pixel may vary according to a location of the first auxiliary sub-pixel.

The display panel may further include a data line extending in a first direction and connected to the first main sub-pixel, and a gate line extending in a second direction and connected to the first main sub-pixel, where the second direction intersects the first direction, and the direction of the long side of the first auxiliary sub-pixel gradually varies from the first direction to the second direction according to a contour of the corner of the main display area.

A short side of the second auxiliary sub-pixel and a short side of the third auxiliary sub-pixel may face the long side of the first auxiliary sub-pixel, respectively.

A vertical distance between the short side of the second auxiliary sub-pixel and the long side of the first auxiliary sub-pixel may be the same as a vertical distance between the short side of the third auxiliary sub-pixel and the long side of the first auxiliary sub-pixel.

A length of the long side of the first auxiliary sub-pixel may be greater than a sum of a length of the short side of the second auxiliary sub-pixel and a length of the short side of the third auxiliary sub-pixel.

A vertical distance between the first main sub-pixel and the long side of the first auxiliary sub-pixel may be less than each of a vertical distance between the first main sub-pixel and the short side of the second auxiliary sub-pixel and a vertical distance between the first main sub-pixel and the short side of the third auxiliary sub-pixel.

The display panel may further include a data line extending in a first direction and connected to the first main sub-pixel, and a gate line extending in a second direction and connected to the first main sub-pixel, where the second direction intersects the first direction, and a direction of a long side or a short side of the first auxiliary sub-pixel is the first direction.

When the direction of the short side of the first auxiliary sub-pixel is the first direction, the long side of the first auxiliary sub-pixel and a long side of the second auxiliary sub-pixel may face each other, and the short side of the first auxiliary sub-pixel and a short side of the second auxiliary sub-pixel may face a long side of the third auxiliary sub-pixel, respectively.

A length of the short side of the first auxiliary sub-pixel may be less than a difference between a length of the long side of the third auxiliary sub-pixel and a length of the short side of the second auxiliary sub-pixel.

A vertical distance between a virtual line parallel to a tangent line contacting the corner of the main display area and a corner facing the virtual line from among corners of the first auxiliary sub-pixel may be less than each of a vertical distance between the virtual line and a corner of the second auxiliary sub-pixel and a vertical distance between the virtual line and a corner of the third auxiliary sub-pixel.

The main pixel may include two first main sub-pixels, one second main sub-pixel, and one third main sub-pixel, where a quadrangle is formed when centers of the first main sub-pixels, the second main sub-pixel, and the third main sub-pixel are connected.

The first main sub-pixels may be located in different columns, the second main sub-pixel may be located in a column between the columns of the first main sub-pixels, and the second main sub-pixel and the third main sub-pixel may be located in a same column.

A size of the first auxiliary sub-pixel may be greater than a size of the first main sub-pixel, in a plan view.

A resolution of the main display area may be higher than a resolution of the corner display area.

The first wavelength band may range from about 490 nanometers (nm) to about 570 nm.

According to one or more embodiments, a display panel includes a substrate including a main display area and a corner display area connected to a corner of the main display area, and an auxiliary pixel located in the corner display area, and including a first auxiliary sub-pixel, a second auxiliary sub-pixel, and a third auxiliary sub-pixel each having a rectangular shape. The first auxiliary sub-pixel is located to face the main display area, and a length of a long side of the first auxiliary sub-pixel is greater than a sum of a length of a short side of the second auxiliary sub-pixel and a length of a short side of the third auxiliary sub-pixel.

The first auxiliary sub-pixel may be located closer to the main display area than the second auxiliary sub-pixel and the third auxiliary sub-pixel.

A vertical distance between the short side of the second auxiliary sub-pixel and the long side of the first auxiliary sub-pixel may be same as a vertical distance between the short side of the third auxiliary sub-pixel and the long side of the first auxiliary sub-pixel.

A direction of the long side of the first auxiliary sub-pixel may vary according to a location of the first auxiliary sub-pixel.

The display panel may further include a first main sub-pixel located in the main display area, a data line extending in a first direction and connected to the first main sub-pixel, and a gate line extending in a second direction and connected to the first main sub-pixel, where the second direction intersects the first direction, and a direction of the long side of the first auxiliary sub-pixel gradually varies from the first direction to the second direction according to a contour of the corner of the main display area.

A vertical distance between the first main sub-pixel and the long side of the first auxiliary sub-pixel may be less than each of a vertical distance between the first main sub-pixel and the short side of the second auxiliary sub-pixel and a vertical distance between the first main sub-pixel and the short side of the third auxiliary sub-pixel.

The display panel may further include a first main sub-pixel located in the main display area, a data line extending in a first direction and connected to the first main sub-pixel, and a gate line extending in a second direction and connected to the first main sub-pixel, where the second direction intersects the first direction, and a direction of the long side of the first auxiliary sub-pixel is the first direction.

A vertical distance between a virtual line parallel to a tangent line contacting the corner of the main display area and a corner facing the virtual line from among corners of the first auxiliary sub-pixel may be less than each of a vertical distance between the virtual line and a corner of the second auxiliary sub-pixel and a vertical distance between the virtual line and a corner of the third auxiliary sub-pixel.

According to one or more embodiments, a display apparatus includes: a display panel including a substrate including a main display area and a corner display area, where the corner display area extends from a corner of the main display area and is bent with a preset radius of curvature; a main pixel located in the main display area and including at least one first main sub-pixel which emits light of a first wavelength band, at least one second main sub-pixel which emits light of a second wavelength band, and at least one third main sub-pixel which emits light of a third wavelength band; and an auxiliary pixel located in the corner display area and including a first auxiliary sub-pixel which emits light of the first wavelength band, a second auxiliary sub-pixel which emits light of the second wavelength band, and a third auxiliary sub-pixel which emits light of the third wavelength band; and a window covering the display panel. The number of the at least one first main sub-pixel included in the main pixel is greater than each of the number of the at least one second main sub-pixel and the number of the at least one third main sub-pixel, and the first auxiliary sub-pixel is located closer to the main display area than the second auxiliary sub-pixel and the third auxiliary sub-pixel.

Each of the first auxiliary sub-pixel, the second auxiliary sub-pixel, and the third auxiliary sub-pixel may have a rectangular planar shape.

The display apparatus may further include a data line extending in a first direction and connected to the first main sub-pixel, and a gate line extending in a second direction and connected to the first main sub-pixel, where the second direction intersects the first direction, and a direction of a long side of the first auxiliary sub-pixel gradually varies from the first direction to the second direction according to a contour of the corner of the main display area.

A short side of the second auxiliary sub-pixel and a short side of the third auxiliary sub-pixel may face the long side of the first auxiliary sub-pixel, respectively, where a length of the long side of the first auxiliary sub-pixel is greater than a sum of a length of the short side of the second auxiliary sub-pixel and a length of the short side of the third auxiliary sub-pixel.

A vertical distance between the first main sub-pixel and the long side of the first auxiliary sub-pixel may be less than each of a vertical distance between the first main sub-pixel and a short side of the second auxiliary sub-pixel and a vertical distance between the first main sub-pixel and a short side of the third auxiliary sub-pixel.

Other aspects, features, and advantages of the disclosure will become more apparent from the drawings, the claims, and the detailed description.

These general and specific embodiments may be implemented by using a system, a method, a computer program, or a combination of the system, the method, and the computer program.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
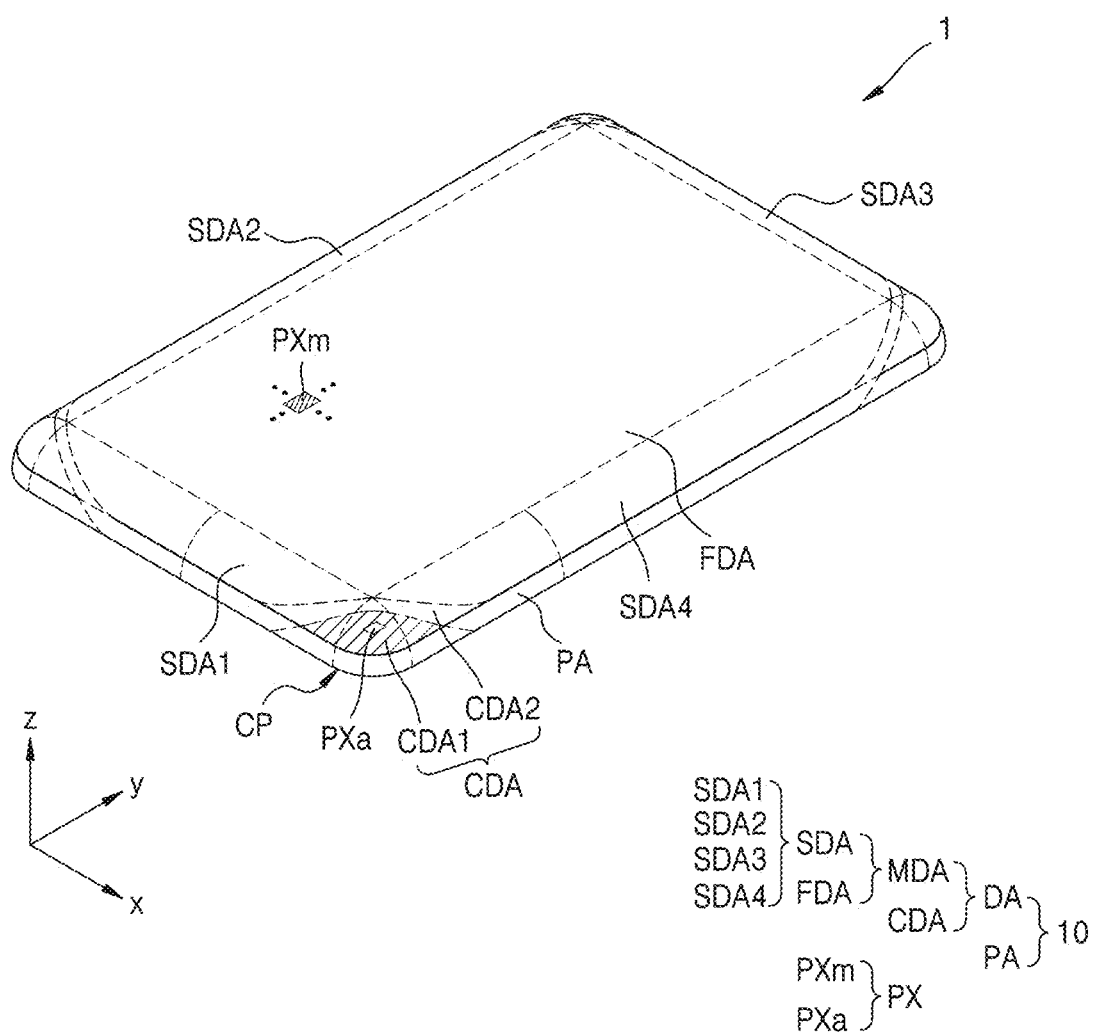
FIG. 1 is a perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below in detail with reference to the drawings. However, the disclosure according to the invention is not limited to the following embodiments and may be embodied in various forms.

Hereinafter, embodiments will be described in detail with reference to the accompanying drawings, wherein the same or corresponding elements are denoted by the same reference numerals throughout and a repeated description thereof is omitted.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that the terms "including," "having," and "comprising" are intended to indicate the existence of the features or elements described in the specification, and are not intended to preclude the possibility that one or more other features or elements may exist or may be added.

It will be understood that when a layer, an area, or an element is referred to as being "on" another layer, area, or element, it may be directly on the other layer, area, or element, or intervening layers, areas, or elements may be present therebetween.

Sizes of elements in the drawings may be exaggerated or contracted for convenience of explanation. For example, because sizes and thicknesses of elements in the drawings are arbitrarily illustrated for convenience of explanation, the disclosure according to the invention is not limited thereto.

When a certain embodiment may be implemented differently, a specific process order may be different from the described order. For example, two consecutively described processes may be performed substantially at the same time or performed in an order opposite to the described order.

"A and/or B" is used herein to select only A, select only B, or select both A and B. "At least one of A and B" is used to select only A, select only B, or select both A and B.

It will be understood that when a layer, an area, or an element is referred to as being "connected" to another layer, area, or element, it may be "directly connected" to the other layer, area, or element and/or may be "indirectly connected" to the other layer, area, or element with other layers, areas, or elements interposed therebetween. For example, when a layer, an area, or an element is referred to as being "electrically connected," it may be directly electrically connected, and/or may be indirectly electrically connected with intervening layers, areas, or elements therebetween.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 2A:
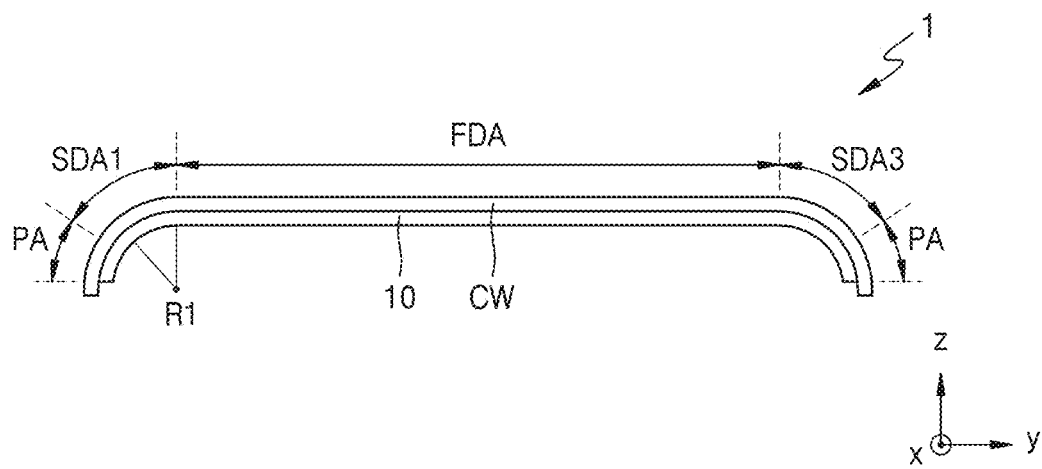
FIGS. 2A, 2B, and 2C are cross-sectional views of a display apparatus according to an embodiment.
Figure 2B:
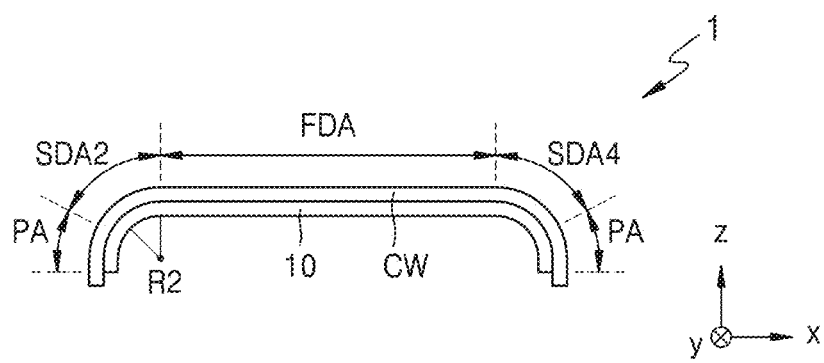
Figure 2C:
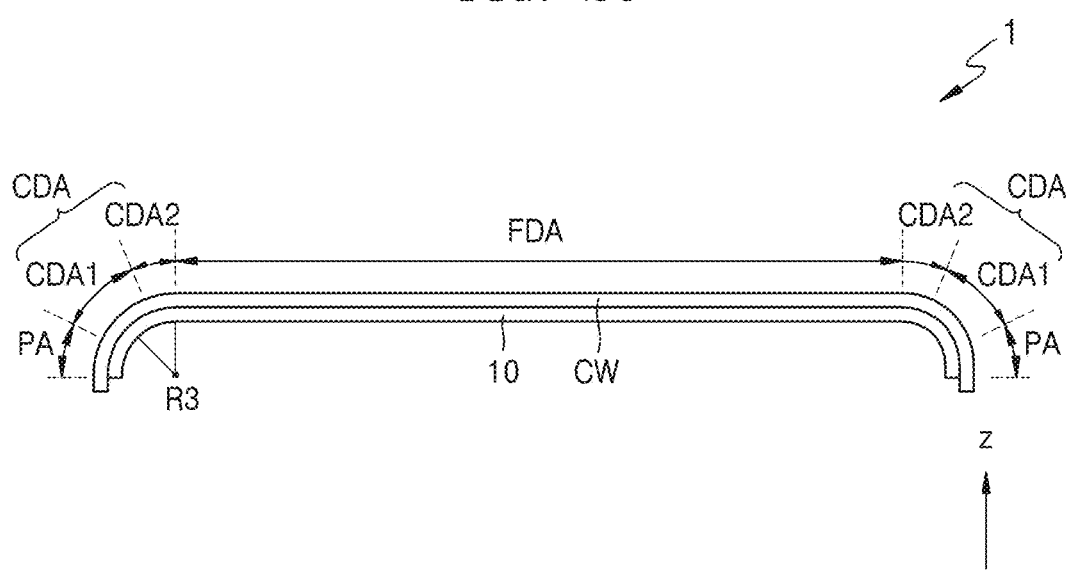

FIG. 1 is a perspective view of a display apparatus according to an embodiment. FIGS. 2A, 2B, and 2C are cross-sectional views of a display apparatus according to an embodiment. In detail, FIG. 2A is a cross-sectional view of a display apparatus in a y direction of FIG. 1. FIG. 2B is a cross-sectional view of the display apparatus in an x direction of FIG. 1. FIG. 2C is a cross-sectional view of the display apparatus in which corner display areas are located on both sides of a front display area.

Referring to FIG. 1, a display apparatus 1 for displaying a moving image or a still image may be used as a display screen of not only a portable electronic device such as a mobile phone, a smartphone, a tablet personal (PC) computer, a mobile communication terminal, an electronic organizer, an electronic book, a portable multimedia player ("PMP"), a navigation device, or an ultra-mobile PC ("UMPC") but also any of various products such as a television, a laptop computer, a monitor, an advertisement board, or an Internet of things ("IoT") product.

The display apparatus 1 may be used in a wearable device such as a smart watch, a watch phone, a glasses-type display, or a head-mounted display ("HMD"). Also, the display apparatus 1 may be used as a center information display ("CID") located on an instrument panel, a center fascia, or a dashboard of a vehicle, a room mirror display replacing a side-view mirror of a vehicle, or a display located on the back of a front seat for entertainment for a back seat of a vehicle.

The display apparatus 1 may have a long side (i.e., longitudinal side) of a first direction and a short side (i.e., latitudinal direction) of a second direction. The first direction and the second direction may intersect each other. For example, an acute angle may be formed between the first direction and the second direction. Alternatively, an obtuse angle or a right angle may be formed between the first direction and the second direction. The following will be described in detail assuming that a right angle is formed between the first direction (e.g., the y direction) and the second direction (e.g., the x direction).

Alternatively, a length of a side of the display apparatus 1 in the first direction (e.g., the y direction) and a length of a side of the display apparatus 1 in the second direction (e.g., the x direction) may be the same. Alternatively, the display apparatus 1 may have a short side in the first direction (e.g., the y direction) and a long side in the second direction (e.g., the x direction).

A corner where a long side in the first direction (e.g., the y direction) and a short side in the second direction (e.g., the x direction) meet each other may be rounded to have a certain curvature.

Referring to FIGS. 2A through 2C, the display apparatus 1 may include a display panel 10 and a cover window CW. The cover window CW may protect the display panel 10.

The cover window CW may be a flexible window. The cover window CW may protect the display panel 10 by being easily bent by an external force without generating cracks. The cover window CW may include glass, sapphire, or plastic. For example, the cover window CW may include ultra-thin glass ("UTG™") or colorless polyimide ("CPI"). In an embodiment, the cover window CW may have a structure in which a flexible polymer layer is located on a surface of a glass substrate, or may include only a polymer layer.

The display panel 10 may be located under the cover window CW. Although not shown in FIGS. 2A through 2C, the display panel 10 may be attached to the cover window CW by a transparent adhesive member such as an optically clear adhesive ("OCA").

The display panel 10 may include a display area DA for displaying an image, and a peripheral area PA surrounding the display area DA. The display area DA may include a plurality of pixels PX, and may display an image through the plurality of pixels PX. Each of the plurality of pixels PX may include sub-pixels. For example, each of the plurality of pixels PX may include a red sub-pixel, a green sub-pixel, and a blue sub-pixel. Alternatively, each of the plurality of pixels PX may include a red sub-pixel, a green sub-pixel, a blue sub-pixel, and a white sub-pixel.

The display area DA may include a main display area MDA, and a corner display area CDA connected to a corner of the main display area MDA. Each of the main display area MDA and the corner display area CDA may include a plurality of pixels PX. The main display area MDA may include a plurality of main pixels PXm, and the corner display area CDA may include a plurality of auxiliary pixels PXa. The main display area MDA may display an image through the plurality of main pixels PXm, and the corner display area CDA may display an image through the plurality of auxiliary pixels PXa.

In an embodiment, for example, the plurality of pixels PX of the main display area MDA and the corner display area CDA may provide independent images, respectively. Alternatively, the plurality of pixels PX of the main display area MDA and the corner display area CDA may provide portions of one image together.

The main display area MDA may include a front display area FDA and a side display area SDA. The front display area FDA may correspond to a flat portion of the main display area MDA. The side display area SDA may include a first side display area SDA1, a second side display area SDA2, a third side display area SDA3, and a fourth side display area SDA4. In an embodiment, at least one of the first side display area SDA1, the second side display area SDA2, the third side display area SDA3, and the fourth side display area SDA4 may be omitted.

The first side display area SDA1 and the third side display area SDA3 may be connected in the first direction (e.g., the y direction) to the front display area FDA. For example, the first side display area SDA1 may be connected in a −y direction from the front display area FDA, and the third side display area SDA3 may be connected in a +y direction from the front display area FDA.

The first side display area SDA1 and the third side display area SDA3 may be bent with a certain radius of curvature. For example, radii of curvature of the first side display area SDA1 and the third side display area SDA3 may be different from each other. Alternatively, radii of curvature of the first side display area SDA1 and the third side display area SDA3 may be the same. The following will be described assuming that the first side display area SDA1 and the third side display area SDA3 have the same radius of curvature that is a first radius of curvature R1. Also, because the first side display area SDA1 and the third side display area SDA3 are the same or similar to each other, the following will focus on the first side display area SDA1.

The second side display area SDA2 and the fourth side display area SDA4 may be connected in the second direction (e.g., the x direction) to the front display area FDA. For example, the second display area SDA2 may be connected in a −x direction from the front display area FDA, and the fourth side display area SDA4 may be connected to a +x direction from the front display area FDA.

The second side display area SDA2 and the fourth side display area SDA4 may be bent with a certain radius of curvature. For example, radii of curvature of the second side display area SDA2 and the fourth side display area SDA4 may be different from each other. Alternatively, radii of curvature of the second side display area SDA2 and the fourth side display area SDA4 may be the same. The following will be described assuming that the second side display area SDA2 and the fourth side display area SDA4 have the same radius of curvature that is a second radius of curvature R2. Also, because the second side display area SDA2 and the fourth side display area SDA4 are the same or similar to each other, the following will focus on the second side display area SDA2.

In an embodiment, the first radius of curvature R1 of the first side display area SDA1 may be different from the second radius of curvature R2 of the second side display area SDA2. For example, the first radius of curvature R1 may be less than the second radius of curvature R2. Alternatively, the first radius of curvature R1 may be greater than the second radius of curvature R2.

In another embodiment, the first radius of curvature R1 of the first side display area SDA1 may be the same as the second radius of curvature R2 of the second side display area SDA2. The following will be described assuming that the first radius of curvature R1 is greater than the second radius of curvature R2.

Each of the front display area FDA and the side display area SDA included in the main display area MDA may include a plurality of main pixels PXm. The front display area FDA may provide most images through the plurality of main pixels PXm. The side display area SDA may display an image through the plurality of main pixels PXm.

The corner display area CDA may extend from a corner of the front display area FDA and may be bent. The corner display area CDA may be located to correspond to a corer portion CP. The corner portion CP that is a corner of the display area DA may be a portion where a long side of the display area DA in the first direction (e.g., the y direction) and a short side of the display area DA in the second direction (e.g., the x direction) meet each other.

The corner display area CDA may be located between adjacent side display areas SDA. For example, the corner display area CDA may be located between the first side display area SDA1 and the second side display area SDA2. The corner display area CDA may be located between the second side display area SDA2 and the third side display area SDA3, between the third side display area SDA3 and the fourth side display area SDA4, or between the fourth side display area SDA4 and the first side display area SDA1. Accordingly, the side display area SDA and the corner display area CDA may surround the front display area FDA, and may each be bent with a certain radius of curvature.

A third radius of curvature R3 of the corner display area CDA may be variable. For example, when the first radius of curvature R1 of the first side display area SDA1 and the second radius of curvature R2 of the second side display area SDA2 are different from each other, the third radius of curvature R3 of the corner display area CDA may gradually change within a range between the first radius of curvature R1 and the second radius of curvature R2.

In an embodiment, when the first radius of curvature R1 of the first side display area SDA1 is greater than the second radius of curvature R2 of the second side display area SDA2, the third radius of curvature R3 of the corner display area CDA may gradually decrease in a direction from the first side display area SDA1 to the second side display area SDA2. For example, the third radius of curvature R3 of the corner display area CDA may be less than the first radius of curvature R1 and may be greater than the second radius of curvature R2.

The corner display area CDA may include a first corner display area CDA1 and a second corner display area CDA2. The second corner display area CDA2 may be located between the first corner display area CDA1 and the main display area MDA. In an embodiment, the second corner display area CDA2 may extend between the side display area SDA and the first corner display area CDA1. For example, the second corner display area CDA2 may extend between the first side display area SDA1 and the first corner display area CDA1. Also, the second corner display area CDA2 may extend between the second side display area SDA2 and the first corner display area CDA1.

In an embodiment, a voltage wiring for supplying a voltage and/or a gate driving circuit may be located in the second corner display area CDA2. A plurality of auxiliary pixels PXa may be located in the second corner display area CDA2 as described above, and the plurality of auxiliary pixels PXa may overlap the voltage wiring and/or the gate driving circuit in a plan view. The plurality of auxiliary pixels PXa may be located on the voltage wiring and/or the gate driving circuit.

In an embodiment, a pixel circuit electrically connected to the auxiliary pixel PXa located in the second corner display area CDA2 may be located in the main display area MDA and/or the first corner display area CDA1. That is, the pixel circuit electrically connected to the auxiliary pixel PXa may not be located in the second corner display area CDA2. The pixel circuit electrically connected to the auxiliary pixel PXa may not overlap the auxiliary pixel PXa in a plan view. The auxiliary pixel PXa may be driven by being electrically connected to the pixel circuit located in the main display area MDA and/or the first corner display area CDA1.

In the present embodiment, the display apparatus 1 may display images in the side display area SDA and the corner display area CDA as well as in the front display area FDA. Accordingly, the proportion of the display area DA occupied in the display apparatus 1 may increase. Also, because the display apparatus 1 includes the corner display area CDA that is bent at a corner and displays an image, aesthetics may be enhanced.

Figure 3:
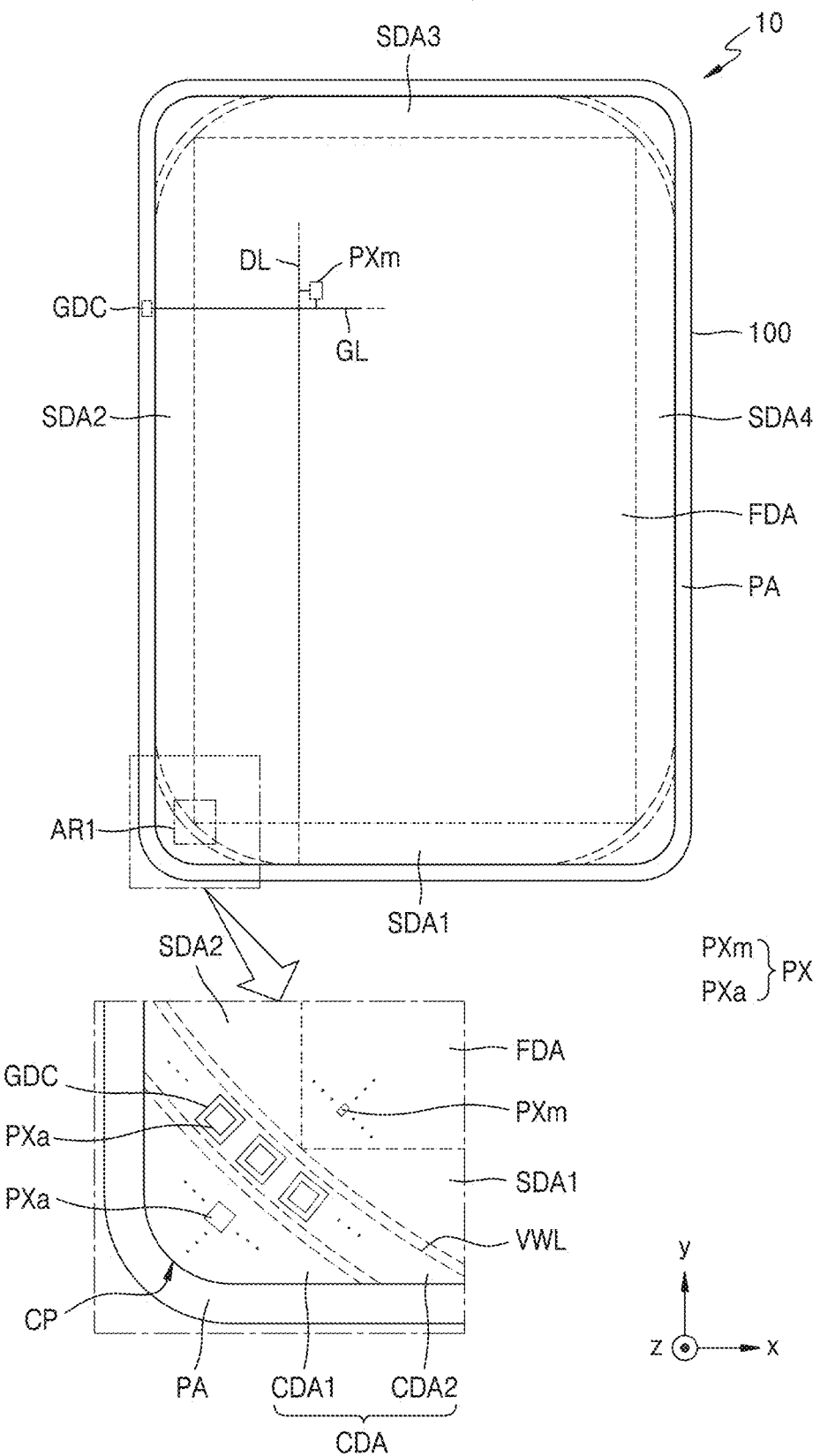
FIG. 3 is a plan view of a display panel according to an embodiment.

FIG. 3 is a plan view of a display panel according to an embodiment. In detail, FIG. 3 is a plan view illustrating a shape of the display panel before a side display area and a corner display area of the display panel are bent. That is, FIG. 3 is a plan view illustrating a state where the side display area and the corner display area of the display panel are unbent. Also, in FIG. 3, the same members as those illustrated in FIG. 1 are denoted by the same reference numerals, and thus a repeated description thereof will be omitted.

The display panel 10 may include a display element. For example, the display panel 10 may be an organic light-emitting display panel using an organic light-emitting diode including an organic emission layer, a micro light-emitting diode display panel using a micro light-emitting diode ("LED"), a quantum dot light-emitting display panel using a quantum dot light-emitting diode including a quantum dot emission layer, or an inorganic light-emitting display panel using an inorganic light-emitting device including an inorganic semiconductor. The following will be described in detail assuming that the display panel 10 is an organic light-emitting display panel using an organic light-emitting diode as a display element.

Referring to FIG. 3, the display panel 10 may include the display area DA and the peripheral area PA. The display area DA may be an area where the plurality of pixels PX display an image, and the peripheral area PA may at least partially surround the display area DA. The display area DA may include the main display area MDA including the front display area FDA and the side display area SDA, and the corner display area CDA.

The display panel 10 may include a substrate 100 and multiple layers located on the substrate 100. In this case, the display area DA and the peripheral area PA may be defined on the substrate 100 and/or the multiple layers. That is, the substrate 100 and/or the multiple layers may include the main display area MDA including the front display area FDA and the side display area SDA, and the corner display area CDA.

The substrate 100 may include glass or a polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate. The substrate 100 including the polymer resin may be flexible, rollable, or bendable. The substrate 100 may have a multi-layer structure including a base layer including the polymer resin and a barrier layer (not shown).

Each of the pixels PX may include sub-pixels, and the sub-pixel may emit light of a predetermined color by using an organic light-emitting diode as a display element. Each organic light-emitting diode may emit, for example, red, green, or blue light. Each organic light-emitting diode may be connected to a pixel circuit including a thin-film transistor and a storage capacitor.

The peripheral area PA may be a non-display area where an image is not provided therethrough. A gate driving circuit GDC and a data driving circuit for applying an electrical signal through a signal line to each pixel PX, and a voltage wiring for supplying a voltage to each pixel PX may be located in the peripheral area PA.

The data driving circuit may apply a data signal to each pixel PX through a data line DL. The data line DL may extend in the first direction (e.g., the y direction), and may be connected to the pixels PX located in the same column. Although not shown in FIG. 3, the data driving circuit may be located on a side of the peripheral area PA. For example, the data driving circuit may be located in the peripheral area PA corresponding to a lower end portion of the display panel 10.

The gate driving circuit GDC may apply a gate signal to each pixel PX through a gate line GL. The gate line GL may extend in the second direction (e.g., the x direction), and may be connected to the pixels PX located in the same row. The gate line GL may include a scan line and an emission control line, and the gate signal may include a scan signal and an emission control signal. The gate driving circuit GDC may include a scan driving circuit, and may apply a scan signal to each pixel PX through the scan line. Also, the gate driving circuit GDC may include an emission control driving circuit, and may apply an emission control signal to each pixel PX through the emission control line.

The gate driving circuit GDC may be located on a side of the peripheral area PA. For example, as shown in FIG. 3, the gate driving circuit GDC may be located in the peripheral area PA corresponding to a left portion of the display panel 10. Alternatively, the gate driving circuit GDC may be located in the peripheral area PA corresponding to a right portion of the display panel 10. The gate driving circuit GDC may be located in the peripheral areas PA corresponding to left and right portions of the display panel 10. Alternatively, the gate driving circuit GDC may be located in the peripheral area PA corresponding to a lower end portion of the display panel 10.

In an embodiment, the gate driving circuit GDC may be located on the same side as the data driving circuit. The gate driving circuit GDC may be located on a side of the peripheral area PA along with the data driving circuit. For example, the gate driving circuit GDC and the data driving circuit may be located in the peripheral area PA corresponding to a lower end portion of the display panel 10. Alternatively, the gate driving circuit GDC and the data driving circuit may be located in the peripheral area PA corresponding to a left or right portion of the display panel 10.

The peripheral area PA may include a pad unit (not shown) to which an electronic device or a printed circuit board may be electrically connected. The pad unit may be exposed without being covered by an insulating layer, and may be electrically connected to a flexible printed circuit board ("FPCB"). The flexible printed circuit board may electrically connect a controller and the pad unit, and may apply a signal or power transmitted from the controller.

Referring to an enlarged portion of FIG. 3, the auxiliary pixel PXa including a display element may be located in the corner display area CDA, and the corner display area CDA may be bent. That is, the corner display area CDA may be located to correspond to the corner portion CP and may be a portion bent with a certain radius of curvature from a corner of the main display area MDA, as described with reference to FIG. 1.

When the corner display area CDA is bent, compressive strain may be greater than tensile strain in the corner display area CDA. In this case, a shrinkable substrate and a shrinkable multi-layer structure may need to be applied to the corner display area CDA. Accordingly, a stacked structure of multiple layers or a shape of the substrate 100 located in the corner display area CDA may be different from a stacked structure of multiple layers or a shape of the substrate 100 located in the front display area FDA. In an embodiment, the corner display area CDA may include a plurality of strip portions extending away from the front display area FDA, and a through-portion may be provided between adjacent strip portions.

In an embodiment, the auxiliary pixel PXa may be electrically connected to a pixel circuit located in the main display area MDA. In another embodiment, the auxiliary pixel PXa may be electrically connected to a pixel circuit located in the corner display area CDA. In this case, the pixel circuit located in the corner display area CDA may share various wirings connected to a pixel circuit located in the main display area MDA. The pixel circuit located in the corner display area CDA may receive a scan signal and a data signal through the wirings.

A voltage wiring VWL for supplying a voltage and/or the gate driving circuit GDC may be located in the second corner display area CDA2 between the main display area MDA and the first corner display area CDA1. In this case, the auxiliary pixel PXa located in the second corner display area CDA2 may overlap the voltage wiring VWL and/or the gate driving circuit GDC in a plan view.

In this case, a pixel circuit electrically connected to the auxiliary pixel PXa located in the second corner display area CDA2 may be located in the main display area MDA.

Figure 4:
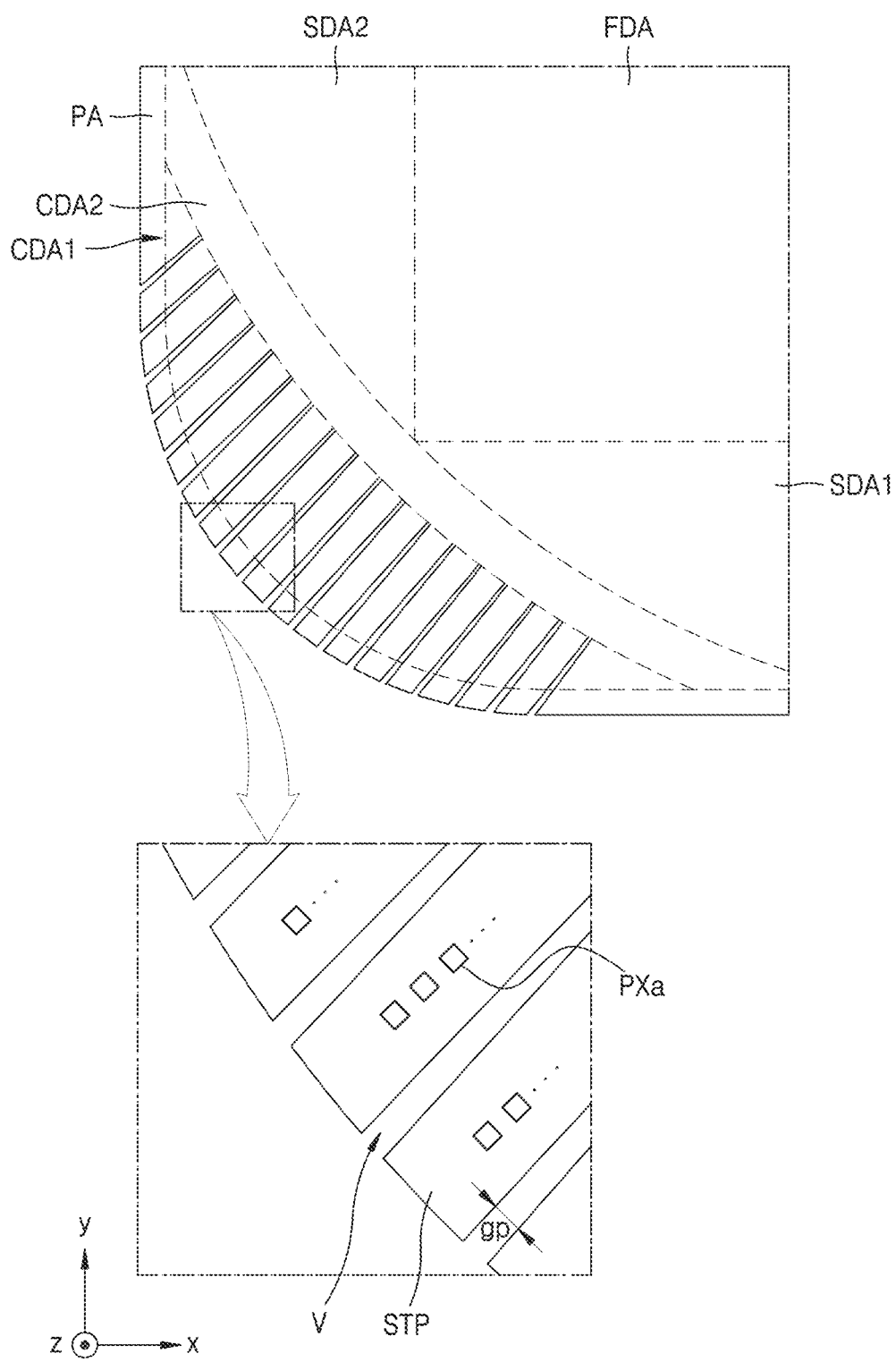
FIG. 4 is an enlarged plan view illustrating a corner portion of FIG. 3.

FIG. 4 is an enlarged plan view illustrating a corner portion of FIG. 3. In detail, FIG. 4 is an enlarged view illustrating a corner display area of a display panel, before the display panel is bent.

Referring to FIG. 4, the display panel 10 may include a plurality of strip portions STP and a plurality of through-portions V located to correspond to the corner display area CDA. The plurality of through-portions V may be located between the plurality of strip portions STP and may penetrate the display panel 10.

Ends of the plurality of strip portions STP may be spaced apart from one another with a certain gap gp therebetween. Due to the gap gp, empty spaces may be formed between the plurality of strip portions STP, and the empty spaces may correspond to the plurality of through-portions V, respectively. The gap gp between the plurality of strip portions STP may be variable. For example, as shown in FIG. 4, the gate gp between the plurality of strip portions STP may increase away from the main display area MDA toward the corner display area CDA. Alternatively, the gap gp between the plurality of strip portions STP may not be variable and may be constant. That is, the plurality of strip portions STP may be radially arranged, or may be arranged parallel to one another.

The other ends of the plurality of strip portions STP may be connected to one another, instead of being spaced apart from one another. As shown in FIG. 4, the plurality of strip portions STP may be connected at a portion adjacent to the main display area MDA. Also, the plurality of strip portions STP may each extend from the main display area MDA to the corner display area CDA, to form the plurality of through-portions V located between the plurality of strip portions STP. Extension lengths of the plurality of strip portions STP may be different from one another. Extension lengths of the plurality of strip portions STP may vary according to a distance between each of the plurality of strip portions STP and a central portion of the corner display area CDA. For example, the strip portions STP located at the central portion from among the plurality of strip portions STP may have greater lengths extending toward the corner display area CDA than those of the other strip portions STP. As a distance between each of the plurality of strip portions STP and the central portion of the corner display area CDA increases, an extension length of each of the plurality of strip portions STP may decrease.

Each through-portion V may penetrate a front surface and a bottom surface of the display panel 10. Each through-portion V may reduce a weight of the display panel 10, and may improve the flexibility of the display panel 10. Also, when an external force (e.g., a curving force, a bending force, or a pulling force) is applied to the display panel 10, shapes of the through-portions V may be changed, thereby easily reducing the occurrence of stress during deformation of the display panel 10, preventing abnormal deformation of the display panel 10, and improving durability. Accordingly, user convenience may be improved when an electronic device including the display panel 10 is used, and the display panel 10 may be easily applied to a wearable device.

When an external force is applied to the display panel 10, the area or shape of the through-portion V may be changed, and a location of the strip portion STP may also be changed. For example, when a bending force is applied to edges of the display panel 10 and a corner portion between the edges, the gap gp between the plurality of strip portions STP may be reduced, and thus the area of the through-portion V may be reduced and adjacent strip portions STP may contact each other.

Accordingly, when an external force is applied to the display panel 10, the gap gp between the plurality of strip portions STP and the area of the through-portion V may be changed, and shapes of the plurality of strip portions STP may not be changed. That is, a pixel circuit and a light-emitting device may be located on each of the plurality of strip portions STP, and even when an external force is applied to the display panel 10, shapes of the plurality of strip portions STP are not changed, thereby protecting the pixel circuit and the light-emitting device located on each of the plurality of strip portions STP.

Because shapes of the plurality of strip portions STP may not be changed, the auxiliary pixels PXa may also be located in the corner display area CDA of the display panel 10 having a curvature. Accordingly, the display area DA (see FIG. 1) may extend from the main display area MDA and the side display area SDA to the corner display area CDA. The auxiliary pixels PXa located on the strip portions STP may be spaced apart from one another in one direction. The auxiliary pixels PXa located on the strip portions STP may be arranged in any of various types such as a stripe type, an s-stripe type, or a pentile type.

Figure 5:
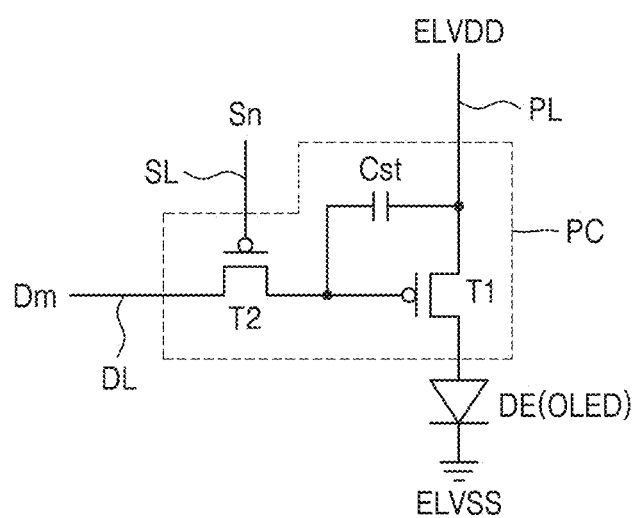
FIG. 5 is an equivalent circuit diagram illustrating a pixel circuit applicable to a display panel, according to an embodiment.

FIG. 5 is an equivalent circuit diagram illustrating a pixel circuit applicable to a display panel, according to an embodiment.

Referring to FIG. 5, a pixel circuit PC may be connected to a scan line SL, a data line DL, and a display element DE. The display element DE may be an organic light-emitting diode OLED. The cathode of the organic light-emitting diode OLED may be a common electrode to which a common voltage ELVSS is applied.

The pixel circuit PC may include a driving thin-film transistor T1, a switching thin-film transistor T2, and a storage capacitor Cst. The switching thin-film transistor T2 is connected to the scan line SL and the data line DL, and transmits a data voltage Dm input through the data line DL to the driving thin-film transistor T1 according to a scan signal Sn input through the scan line SL.

The storage capacitor Cst is connected to the switching thin-film transistor T2 and a driving voltage line PL, and stores a voltage corresponding to a difference between a voltage received from the switching thin-film transistor T2 and a driving voltage ELVDD supplied to the driving voltage line PL.

The driving thin-film transistor T1 may be connected to the driving voltage line PL and the storage capacitor Cst, and may control driving current flowing through the organic light-emitting diode OLED from the driving voltage line PL in response to a value of the voltage stored in the storage capacitor Cst. The organic light-emitting diode OLED may emit light having a certain luminance according to the driving current.

Although the pixel circuit PC includes two thin-film transistors and one storage capacitor in FIG. 5, the disclosure according to the invention is not limited thereto. In another embodiment, for example, the pixel circuit PC may include three or more thin-film transistors and/or two or more storage capacitors. In an embodiment, the pixel circuit PC may include seven thin-film transistors and one storage capacitor.

Figure 6:
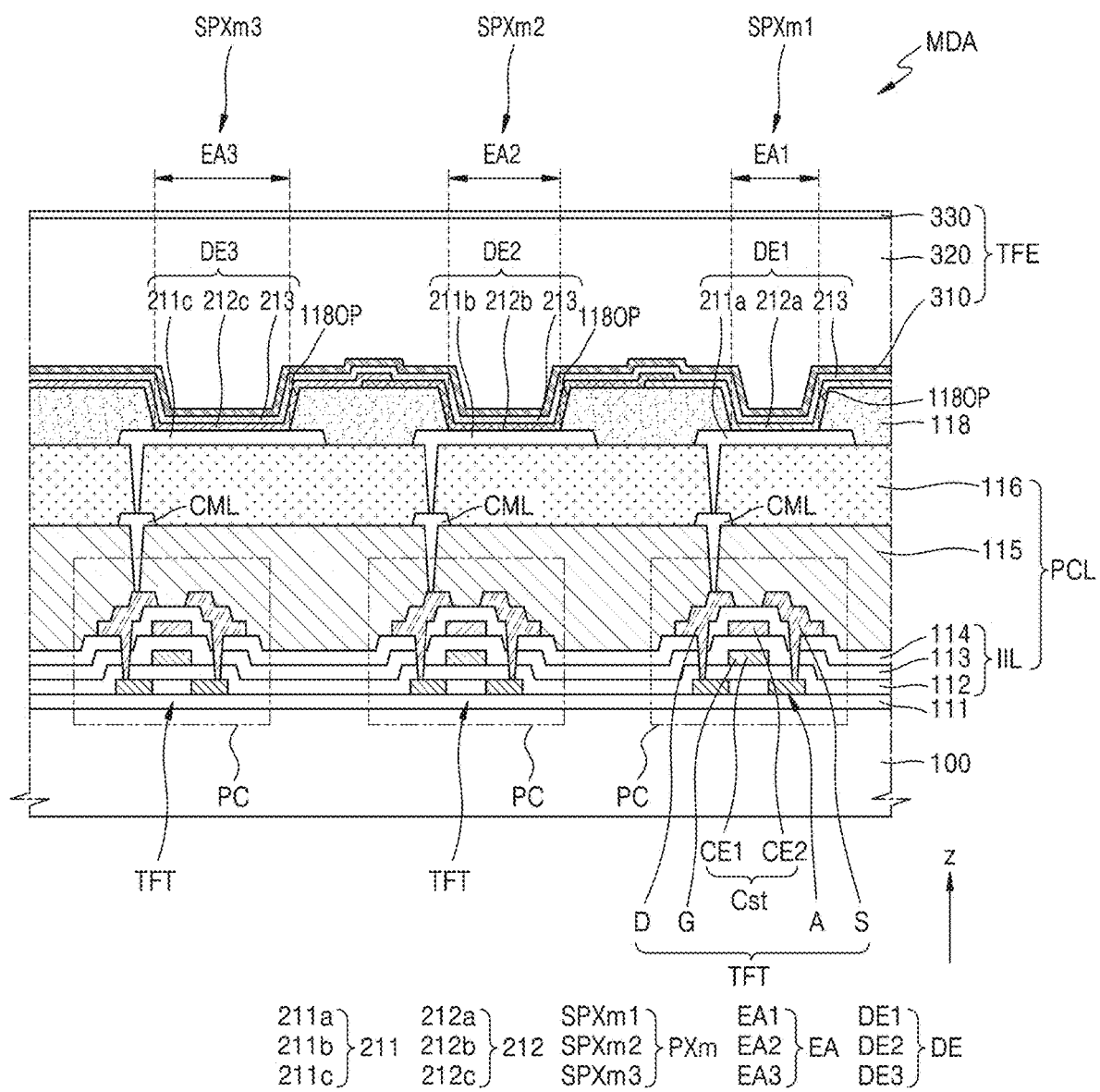
FIG. 6 is a cross-sectional view illustrating a main pixel and a pixel circuit located in a main display area of a display panel, according to an embodiment.

FIG. 6 is a cross-sectional view illustrating a main pixel and a pixel circuit located in a main display area of a display panel, according to an embodiment. In detail, FIG. 6 is a cross-sectional view illustrating a main pixel located in a main display area, and some members may be omitted. Multiple layers stacked in a display apparatus will now be described in detail with reference to FIG. 6.

Referring to FIG. 6, the display panel 10 (see FIG. 3) may include the substrate 100, a buffer layer 111, a pixel circuit layer PCL, the display element DE, and a thin-film encapsulation layer TFE.

Also, as described with reference to FIG. 3, the main pixel PXm may be located in the main display area MDA of the display panel 10. The main pixel PXm may include a first main sub-pixel SPXm1, a second main sub-pixel SPXm2, and a third main sub-pixel SPXm3. The first main sub-pixel SPXm1 that is a minimum unit for displaying an image may correspond to a first emission area EA1 that emits light due to a first display element DE1. When an organic light-emitting diode is used as the first display element DE1, the first emission area EA1 may be defined by an opening 118OP of a pixel-defining film 118. Although the first main sub-pixel SPXm1 is mainly described, the same description may apply to the second main sub-pixel SPXm2 and the third main sub-pixel SPXm3, which will be described below in detail.

Although the first main sub-pixel SPXm1, the second main sub-pixel SPXm2, and the third main sub-pixel SPXm3 are adjacent to one another in FIG. 6, the disclosure according to the invention is not limited thereto. That is, elements such as other wirings may be located between the first main sub-pixel SPXm1, the second main sub-pixel SPXm2, and the third main sub-pixel SPXm3. Also, cross-sections of the first main sub-pixel SPXm1, the second main sub-pixel SPXm2, and the third main sub-pixel SPXm3 in FIG. 6 may not be cross-sections in the same direction.

A display device and devices electrically connected to the display device will be described in more detail according to a stacking order with reference to FIG. 6.

The substrate 100 may include glass or a polymer resin. The substrate 100 including the polymer resin may be flexible, rollable, or bendable. The substrate 100 may have a multi-layer structure including a base layer including the polymer resin and a barrier layer (not shown).

The buffer layer 111 may include an inorganic insulating material such as silicon nitride, silicon oxynitride, or silicon oxide, and may have a single or multi-layer structure including the above inorganic insulating material.

The pixel circuit layer PCL may be located on the buffer layer 111. The pixel circuit layer PCL may include a thin-film transistor TFT included in the pixel circuit PC, and an inorganic insulating layer IIL, a first planarization layer 115, and a second planarization layer 116 located under and/or over elements of the thin-film transistor TFT. The inorganic insulating layer IIL may include a first gate insulating layer 112, a second gate insulating layer 113, and an interlayer insulating layer 114.

The thin-film transistor TFT may include a semiconductor layer A, and the semiconductor layer A may include polysilicon. Alternatively, the semiconductor layer A may include amorphous silicon, an oxide semiconductor, or an organic semiconductor. The semiconductor layer A may include a channel region, and a drain region and a source region located on both sides of the channel region. A gate electrode G may overlap the channel region in a plan view (i.e., view in z-axis).

The gate electrode G may include a low-resistance metal material. The gate electrode G may include a conductive material including molybdenum (Mo), aluminum (Al), copper (Cu), or titanium (Ti), and may have a single or multi-layer structure including the above material.

The first gate insulating layer 112 between the semiconductor layer A and the gate electrode G may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second gate insulating layer 113 may be provided to cover the gate electrode G. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), like the first gate insulating layer 112.

An upper electrode CE2 of the storage capacitor Cst may be located on the second gate insulating layer 113. The upper electrode CE2 may overlap the gate electrode G under the upper electrode CE2 in a plan view. In this case, the gate electrode G and the upper electrode CE2 overlapping each other with the second gate insulating layer 113 therebetween may constitute the storage capacitor Cst of the pixel circuit. That is, the gate electrode G may function as a lower electrode CE1 of the storage capacitor Cst. As such, the storage capacitor Cst and the thin-film transistor TFT may overlap each other in a plan view. In some embodiments, the storage capacitor Cst may not overlap the thin-film transistor TFT.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single or multi-layer structure including the above material.

The interlayer insulating layer 114 may cover the upper electrode CE2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 114 may have a single or multi-layer structure including the above inorganic insulating material.

Each of a drain electrode D and a source electrode S may be located on the interlayer insulating layer 114. Each of the drain electrode D and the source electrode S may include a material having high conductivity. Each of the drain electrode D and the source electrode S may include a conductive material including molybdenum (Mo), aluminum (Al), copper (Cu), or titanium (Ti), and may have a single or multi-layer structure including the above material. In an embodiment, each of the drain electrode D and the source electrode S may have a multi-layer structure including Ti/Al/Ti. Although the thin-film transistor TFT includes both the drain electrode D and the source electrode S in FIG. 6, at least one of the drain electrode D and the source electrode S may be omitted.

The first planarization layer 115 may cover the drain electrode D and the source electrode S. The first planarization layer 115 may include an organic insulating layer. The first planarization layer 115 may include an organic insulating material such as a general-purpose polymer (e.g., polymethyl methacrylate ("PMMA") or polystyrene ("PS")), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

A connection electrode CML may be located on the first planarization layer 115. In this case, the connection electrode CML may be connected to the drain electrode D or the source electrode S through a contact hole of the first planarization layer 115. The connection electrode CML may include a material having high conductivity. The connection electrode CML may include a conductive material including molybdenum (Mo), aluminum (Al), copper (Cu), or titanium (Ti), and may have a single or multi-layer structure including the above material. In an embodiment, the connection electrode CML may have a multi-layer structure including Ti/Al/Ti.

The second planarization layer 116 may cover the connection electrode CML. The second planarization layer 116 may include an organic insulating layer. The second planarization layer 116 may include an organic insulating material such as a general-purpose polymer (e.g., polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

The display element DE may be located on the pixel circuit layer PCL. The display element DE may be an organic light-emitting diode OLED. The display element DE may include a pixel electrode 211, an intermediate layer 212, and a counter electrode 213. The pixel electrode 211 of the display element DE may be electrically connected to the connection electrode CML through a contact hole of the second planarization layer 116.

The pixel electrode 211 may include a conductive oxide such as indium tin oxide ("ITO"), indium zinc oxide ("IZO"), zinc oxide (ZnO), indium oxide (In203), indium gallium oxide ("IGO"), or aluminum zinc oxide ("AZO"). In another embodiment, the pixel electrode 211 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the pixel electrode 211 may further include a film formed of ITO, IZO, ZnO, or $In_2O_3$ over/under the reflective film.

The pixel-defining film 118 defining the opening 118OP through which a central portion of the pixel electrode 211 is exposed may be located on the pixel electrode 211. The pixel-defining film 118 may include an organic insulating material and/or an inorganic insulating material. The opening 118OP may define an emission area EA of light emitted by the display element DE. For example, a width of the opening 118OP may correspond to a width of the emission area EA of the display element DE.

A spacer (not shown) may be located on the pixel-defining film 118. The spacer may prevent damage to the substrate 100, in a method of manufacturing a display apparatus. A mask sheet may be used to manufacture a display panel, and in this case, the spacer may prevent the problem that the mask sheet is introduced into the opening 118OP of the pixel-defining film 118 or is closely attached to the pixel-defining film 118 and thus a part of the substrate 100 is damaged by the mask sheet when a deposition material is deposited on the substrate 100.

The spacer may include an organic insulating material such as polyimide. Alternatively, the spacer may include an inorganic insulating material such as silicon nitride or silicon oxide, or may include an organic insulating material and an inorganic insulating material.

In an embodiment, the spacer may include a material different from that of the pixel-defining film 118. Alternatively, in another embodiment, the spacer may include the same material as that of the pixel-defining film 118, and in this case, the pixel-defining film 118 and the spacer may be formed together in a mask process using a halftone mask or the like.

The intermediate layer 212 may be located on the pixel-defining film 118. The intermediate layer 212 may include a high molecular weight organic material or a low molecular weight organic material emitting light of a certain color. A first functional layer and a second functional layer may be located under and over the intermediate layer 212, respectively. The first functional layer may include, for example, a hole transport layer ("HTL"), or may include a hole transport layer and a hole injection layer ("HIL"). The second functional layer that is located over the intermediate layer 212 may be optional. The second functional layer may include an electron transport layer ("ETL") and/or an electron injection layer ("EIL"). The first functional layer and/or the second functional layer may be a common layer formed to entirely cover the substrate 100, like the counter electrode 213 described below.

The counter electrode 213 may be formed of a conductive material having a low work function. For example, the counter electrode 213 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the counter electrode 213 may further include a layer formed of ITO, IZO, ZnO, or $In_2O_3$ on the (semi)transparent layer including the above material.

In an embodiment, the main pixel PXm may include the first main sub-pixel SPXm1, the second main sub-pixel SPXm2, and the third main sub-pixel SPXm3. The display panel 10 may include the first display element DE1, a second display element DE2, and a third display element DE3 corresponding to the first main sub-pixel SPXm1, the second main sub-pixel SPXm2, and the third main sub-pixel SPXm3, respectively. Each of the first display element DE1, the second display element DE2, and the third display element DE3 may be driven by being electrically connected to the thin-film transistor TFT through the connection electrode CML.

The first display element DE1 may include a first pixel electrode 211a, a first intermediate layer 212a, and the counter electrode 213, the second display element DE2 may include a second pixel electrode 211b, a second intermediate layer 212b, and the counter electrode 213, and the third display element DE3 may include a third pixel electrode 211c, a third intermediate layer 212c, and the counter electrode 213.

A central portion of each of the first pixel electrode 211a, the second pixel electrode 211b, and the third pixel electrode 211c may be exposed through the opening 118OP defined in the pixel-defining film 118. The opening 118OP through which the central portion of the first pixel electrode 211a is exposed may define the first emission area EA1 of light emitted by the first display element DE1. The opening 118OP through which the central portion of the second pixel electrode 211b is exposed may define a second emission area EA2 of light emitted by the second display element DE2. The opening 118OP through which the central portion of the third pixel electrode 211c is exposed may define a third emission area EA3 of light emitted by the third display element DE3.

In an embodiment, sizes of the first emission area EA1, the second emission area EA2, and the third emission area EA3 may be different from one another. Widths of the first emission area EA1, the second emission area EA2, and the third emission area EA3 may be different from one another. For example, as shown in FIG. 6, a size (or a width) of the first emission area EA1 may be less than each of a size (or a width) of each of the second emission area EA2 and the third emission area EA3. A size (or a width) of the second emission area EA2 may be less than a size (or a width) of the third emission area EA3. A size (or a width) of the third emission area EA3 may be the largest.

The first main sub-pixel SPXm1 that is a minimum unit for displaying an image may correspond to the first emission area EA1 that emits light due to the first display element DE1, the second main sub-pixel SPXm2 that is a minimum unit for displaying an image may correspond to the second emission area EA2 that emits light due to the second display element DE2, and the third main sub-pixel SPXm3 that is a minimum unit for displaying an image may correspond to the third emission area EA3 that emits light due to the third display element DE3.

In an embodiment, the first intermediate layer 212a may emit light of a first wavelength band, the second intermediate layer 212b may emit light of a second wavelength band, and the third intermediate layer 212c may emit light of a third wavelength band. For example, the first wavelength band may range from about 490 nanometers (nm) to about 570 nm, the second wavelength band may range from about 630 nm to about 750 nm, and the third wavelength band may range from about 450 nm to about 490 nm. This is merely an example, and wavelength bands of light respectively emitted by the first intermediate layer 212a, the second intermediate layer 212b, and the third intermediate layer 212c may be changed. The first intermediate layer 212a, the second intermediate layer 212b, and the third intermediate layer 212c that emit light of different wavelength bands may be formed by using different fine metal masks ("FMMs").

In an embodiment, as shown in FIG. 6, an end of the first intermediate layer 212a may overlap an end of the second intermediate layer 212b in a plan view. The other end of the second intermediate layer 212b may overlap an end of the third intermediate layer 212c in a plan view. An end of the first intermediate layer 212a may be covered by the second intermediate layer 212b, and an end of the second intermediate layer 212b may be covered by the third intermediate layer 212c. This may be formed when openings of the fine metal mask used to form the first intermediate layer 212a, openings of the fine metal mask used to form the second intermediate layer 212b, and the openings of the fine metal mask used to form the third intermediate layer 212c overlap one another in a plan view.

For example, when layers are formed in an order of the first intermediate layer 212a, the second intermediate layer 212b, and the third intermediate layer 212c, an end of the first intermediate layer 212a may be covered by the second intermediate layer 212b, and an end of the second intermediate layer 212b may be covered by the third intermediate layer 212c. Accordingly, a structure may vary according to an order of forming the first intermediate layer 212a, the second intermediate layer 212b, and the third intermediate layer 212c. For example, when layers are formed in an order of the third intermediate layer 212c, the second intermediate layer 212b, and the first intermediate layer 212a, an end of the third intermediate layer 212c may be covered by the second intermediate layer 212b, and an end of the second intermediate layer 212b may be covered by the first intermediate layer 212a.

Although the first intermediate layer 212a, the second intermediate layer 212b, and the third intermediate layer 212c overlap one another in FIG. 6, the first intermediate layer 212a, the second intermediate layer 212b, and the third intermediate layer 212c may not overlap one another in a plan view. For example, each of the first intermediate layer 212a, the second intermediate layer 212b, and the third intermediate layer 212c may be formed in the opening 118OP defined in the pixel-defining film 118.

In some embodiments, a capping layer (not shown) may be further located on the counter electrode 213. The capping layer may include LiF, an inorganic material, and/or an organic material.

The thin-film encapsulation layer TFE may be located on the counter electrode 213. In an embodiment, the thin-film encapsulation layer TFE may include at least one inorganic encapsulation layer and at least one organic encapsulation layer. In an embodiment, in FIG. 6, the thin-film encapsulation layer TFE includes a first inorganic encapsulation layer 310, an organic encapsulation layer 320, and a second inorganic encapsulation layer 330 that are sequentially stacked.

Each of the first and second inorganic encapsulation layers 310 and 330 may include at least one inorganic material from among aluminum oxide, titanium oxide, tantalum oxide, hafnium oxide, zinc oxide, silicon oxide, silicon nitride, and silicon oxynitride. The organic encapsulation layer 320 may include a polymer-based material. Examples of the polymer-based material may include an acrylic resin, an epoxy resin, polyimide, and polyethylene. In an embodiment, the organic encapsulation layer 320 may include acrylate.

Although not shown in FIG. 6, a touch electrode layer may be located on the thin-film encapsulation layer TFE, and an optical functional layer may be located on the touch electrode layer. The touch electrode layer may obtain coordinate information according to an external input, for example, a touch event. The optical functional layer may reduce a reflectance of light (external light) incident on the display apparatus, and/or improve color purity of light emitted from the display apparatus. In an embodiment, the optical functional layer may include a phase retarder and/or a polarizer. The phase retarder may be of a film type or a liquid crystal coating type, and may include a λ/2 phase retarder and/or a λ/4 phase retarder. The polarizer may also be of a film type or a liquid crystal coating type. The film type polarizer may include a stretchable synthetic resin film, and the liquid crystal coating type polarizer may include liquid crystals arranged in a certain arrangement. The phase retarder and the polarizer may further include a protective film.

In another embodiment, the optical functional layer may include a black matrix and color filters. The color filters may be arranged in consideration of a color of light emitted by each of pixels of the display apparatus. Each of the color filters may include a red, green, or blue pigment or dye. Alternatively, each of the color filters may further include quantum dots in addition to the pigment or dye. Alternatively, some of the color filters may not include the pigment or dye, and may include scattering particles such as titanium oxide.

In another embodiment, the optical functional layer may have a destructive interference structure. The destructive interference structure may include a first reflective layer and a second reflective layer that are located on different layers. First reflected light and second reflected light respectively reflected by the first reflective layer and the second reflective layer may be destructively interfered with each other, thereby reducing a reflectance of external light.

An adhesive member may be located between the touch electrode layer and the optical functional layer. Any adhesive member that is known in the related art may be used without limitation. The adhesive member may be a pressure sensitive adhesive ("PSA").

Figure 7:
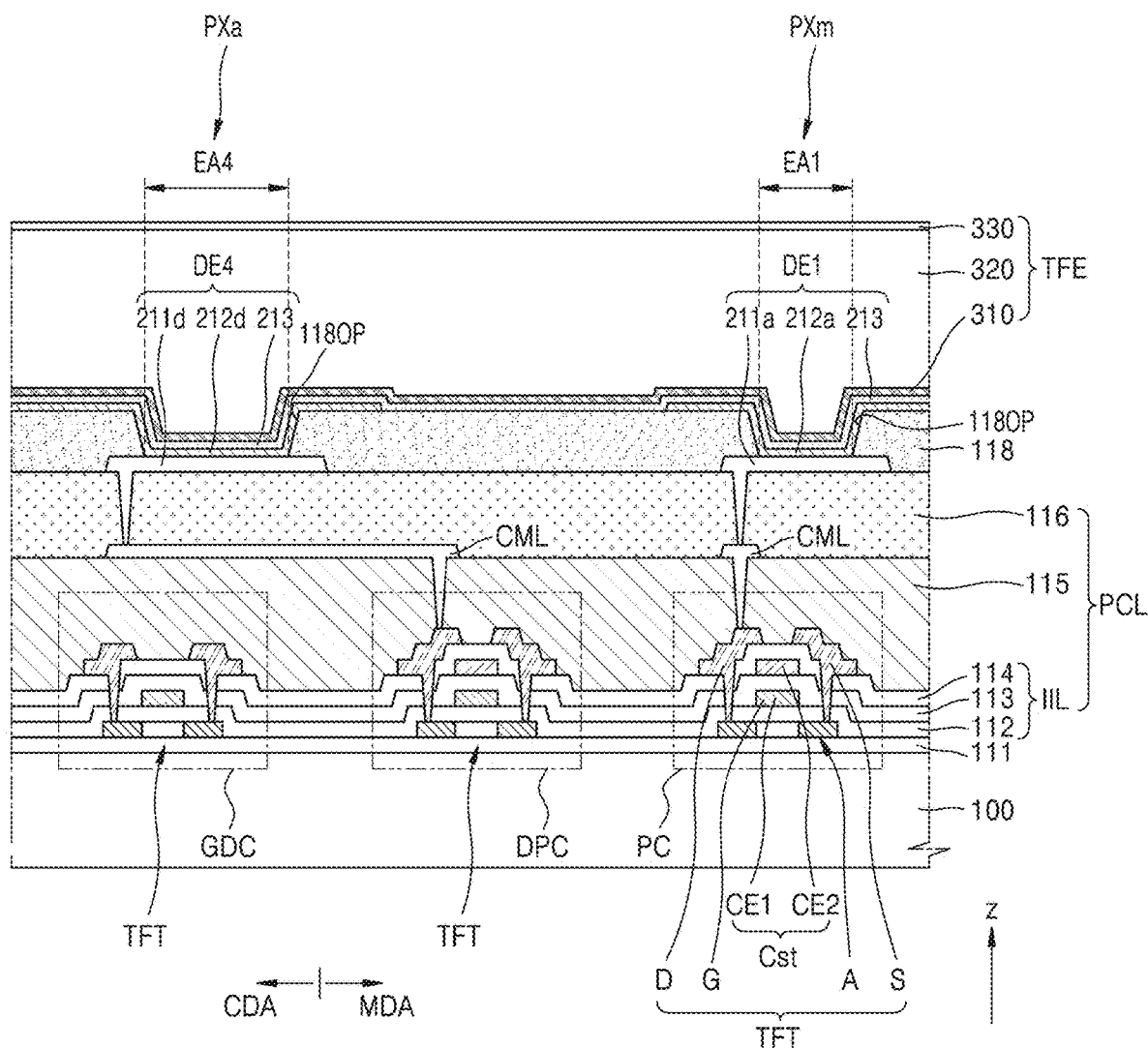
FIG. 7 is a cross-sectional view illustrating a main pixel and a pixel circuit located in a main display area and an auxiliary pixel located in a corner display area of a display panel, according to an embodiment.

FIG. 7 is a cross-sectional view illustrating a main pixel and a pixel circuit located in a main display area and an auxiliary pixel located in a corner display area of a display panel, according to an embodiment. In detail, FIG. 7 is a cross-sectional view illustrating a main pixel located in a main display area and an auxiliary pixel located in a corner display area, and some members may be omitted. In FIG. 7, the same members as those illustrated in FIG. 6 are denoted by the same reference numerals, and thus a repeated description thereof will be omitted.

Referring to FIG. 7, the main pixel PXm, the pixel circuit PC, and a dummy pixel circuit DPC may be located in the main display area MDA. The auxiliary pixel PXa and the gate driving circuit GDC may be located in the corner display area CDA. In detail, the main pixel PXm of FIG. 7 is a main sub-pixel included in the main pixel PXm as described with reference to FIG. 6. Like the main pixel PXm, the auxiliary pixel PXa of FIG. 7 is an auxiliary sub-pixel included in the auxiliary pixel PXa.

The display panel 10 may include the first display element DE1 corresponding to a main sub-pixel included in the main pixel PXm, and a fourth display element DE4 corresponding to an auxiliary sub-pixel included in the auxiliary pixel PXa. In this case, the first display element DE1 may be driven by being electrically connected to the pixel circuit PC including the thin-film transistor TFT through the connection electrode CML. The fourth display element DE4 may be driven by being electrically connected to the dummy pixel circuit DPC including a thin-film transistor TFT through a connection electrode CML. That is, the fourth display element DE4 located in the corner display area CDA may be driven by the dummy pixel circuit DPC located in the main display area MDA. A fourth pixel electrode 211d of the fourth display element DE4 may be connected to the dummy pixel circuit DPC through the connection electrode CML extending to the corner display area CDA. Although the fourth display element DE4 is connected to the dummy pixel circuit DPC located in the main display area MDA in FIG. 7, in another embodiment, the fourth display element DE4 may be connected to a pixel circuit located in the corner display area CDA.

The fourth display element DE4 may include the fourth pixel electrode 211d, a fourth intermediate layer 212d, and the counter electrode 213.

The fourth pixel electrode 211d may be a (semi)transmissive electrode or a reflective electrode. The fourth pixel electrode 211d may include a conductive oxide such as indium tin oxide (ITO), indium zinc oxide (IZO), zinc oxide (ZnO), indium oxide (In$_2$O$_3$), indium gallium oxide (IGO), or aluminum zinc oxide (AZO). A central portion of the fourth pixel electrode 211d may be exposed through the opening 118OP defined in the pixel-defining film 118. The opening 118OP through which the central portion of the fourth pixel electrode 211d is exposed may define a fourth emission area EA4 of light emitted by the fourth display element DE4.

In an embodiment, when the first display element DE1 and the fourth display element DE4 emit light of the same wavelength band, a size of the fourth emission area EA4 may be greater than a size of the first emission area EA1 in a plan view. That is, a size of the auxiliary pixel PXa located in the corner display area CDA may be greater than a size of the main pixel PXm located in the main display area MDA.

The fourth intermediate layer 212d may be located on the pixel-defining film 118. The fourth intermediate layer 212d may include a high molecular weight organic material or a low molecular weight organic material emitting light of a certain color.

The gate driving circuit GDC may be located in the corner display area CDA as described with reference to FIG. 3. As shown in FIG. 7, the gate driving circuit GDC and the auxiliary pixel PXa may overlap each other in a plan view.

Figure 8:
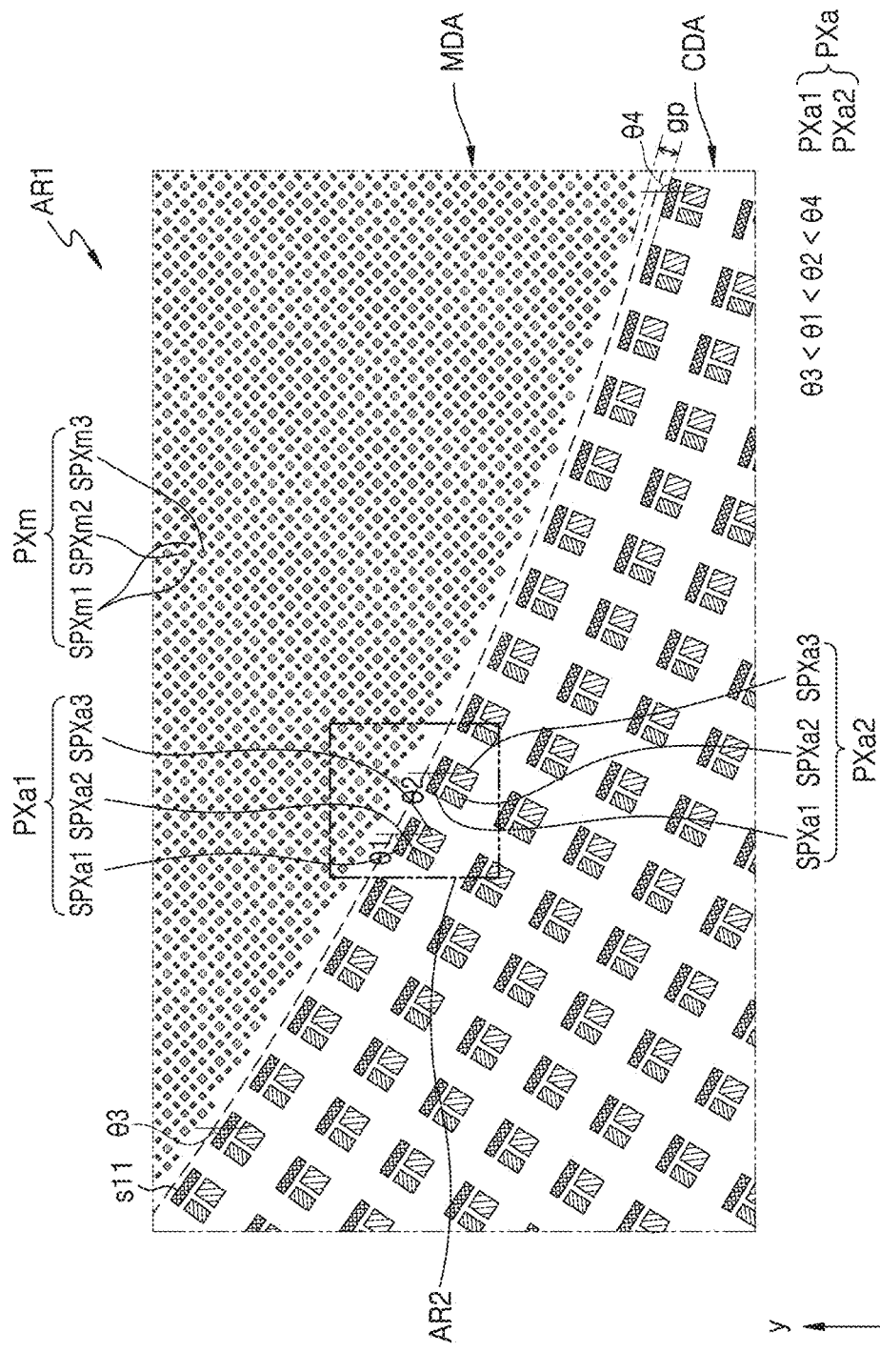
FIG. 8 is an enlarged plan view illustrating a main display area and a corner display area of FIG. 3.
Figure 9:
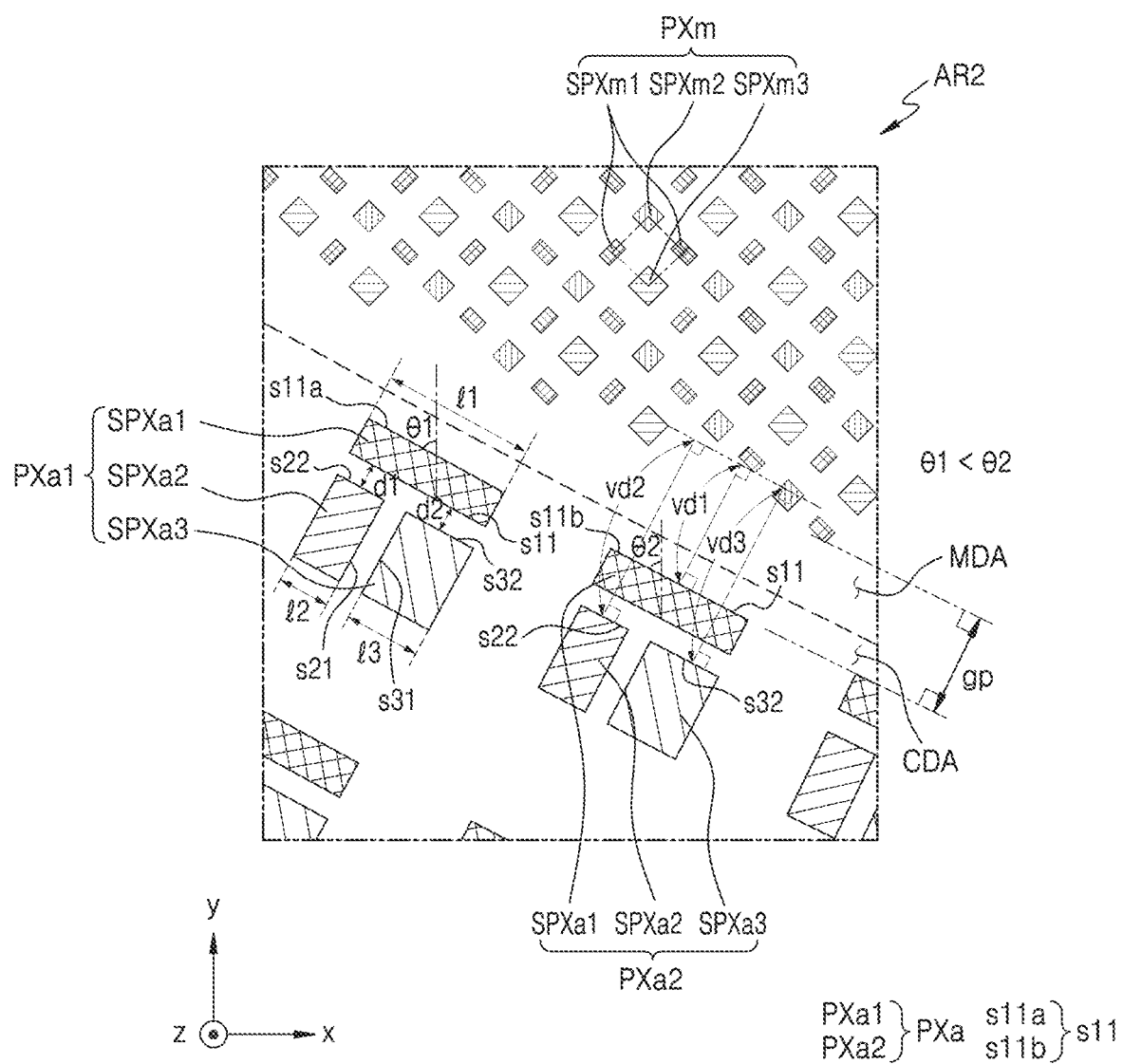
FIG. 9 is an enlarged plan view illustrating a portion of FIG. 8.

FIG. 8 is an enlarged plan view illustrating a portion AR1 of FIG. 3. FIG. 9 is an enlarged plan view illustrating a portion AR2 of FIG. 8. In detail, FIG. 8 is an enlarged view illustrating a part of a corner of a main display area and a part of a corner display area connected to the corner of the main display area. FIG. 9 is an enlarged view illustrating a main pixel located in a main display area and an auxiliary pixel located in a corner display area.

Referring to FIG. 8, a plurality of main pixels PXm may be located in the main display area MDA, and a plurality of auxiliary pixels PXa may be located in the corner display area CDA.

Each of the plurality of main pixels PXm may include the first main sub-pixel SPXm1, the second main sub-pixel SPXm2, and the third main sub-pixel SPXm3. The first main sub-pixel SPXm1 that is a minimum unit for displaying an image may correspond to the first emission area EA1 that emits light due to the first display element DE1 as described with reference to FIG. 6. When an organic light-emitting diode is used as the first display element DE1, the first emission area EA1 may be defined by the opening 118OP of the pixel-defining film 118. Although the first main sub-pixel SPXm1 is mainly described, the same description may apply to the second main sub-pixel SPXm2 and the third main sub-pixel SPXm3.

The first main sub-pixel SPXm1 may emit light of a first wavelength band, the second main sub-pixel SPXm2 may emit light of a second wavelength band, and the third main sub-pixel SPXm3 may emit light of a third wavelength band.

In an embodiment, the first main sub-pixel SPXm1 may emit green light, the second main sub-pixel SPXm2 may emit red light, and the third main sub-pixel SPXm3 may emit blue light. In this case, the first wavelength band may range from about 490 nm to about 570 nm, he second wavelength band may range from about 630 nm to about 750 nm, and the third wavelength band may range from about 450 nm to about 490 nm. However, this is merely an example, and wavelength bands of light respectively emitted by the first main sub-pixel SPXm1, the second main sub-pixel SPXm2, and the third main sub-pixel SPXm3 may be changed.

In an embodiment, the number of the first main sub-pixels SPXm1, the number of the second main sub-pixels SPXm2, and the number of the third main sub-pixels SPXm3 included in each of the plurality of main pixels PXm may be different from one another. The number of the first main sub-pixels SPXm1, the number of the second main sub-pixels SPXm2, and the number of the third main sub-pixels SPXm3 located in the entire main display area MDA may be different from one another.

In an embodiment, for example, the number of the first main sub-pixels SPXm1 included in the main pixel PXm may be greater than each of the number of the second main sub-pixels SPXm2 and the number of the third main sub-pixels SPXm3 included in the main pixel PXm. Referring to FIG. 9, the main pixel PXm may include two first main sub-pixels SPXm1, one second main sub-pixel SPXm2, and one third main sub-pixel SPXm3. In this case, the number of the first main sub-pixels SPXm1 located in the entire main display area MDA may be greater than each of the number of the second main sub-pixels SPXm2 located in the entire main display area MDA and the number of the third main sub-pixels SPXm3 located in the entire main display area MDA.

The first main sub-pixel SPXm1, the second main sub-pixel SPXm2, and the third main sub-pixel SPXm3 may be arranged in a pentile structure. For example, referring to FIG. 9, two first main sub-pixels SPXm1 located in different columns, one second main sub-pixel SPXm2 located in a column different from and between those of the first main sub-pixels SPXm1, and the third main sub-pixel SPXm3 located in the same column as that of the second main sub-pixel SPXm2 may be defined as one group (See dot-dashed diamond in upper part of FIG. 9). In this case, a quadrangle may be formed when the centers of the two first main sub-pixel SPXm1, the one second main sub-pixel SPXm2, and the one third main sub-pixel SPXm3 are connected. A size (e.g., area in a plan view) of the first main sub-pixel SPXm1 may be less than a size of each of the second main sub-pixel SPXm2 and the third main sub-pixel SPXm3. Such a pixel arrangement structure may be referred to as a pentile matrix structure or a pentile structure, and a rendering driving method that represents a color by sharing adjacent pixels may be used, thereby displaying an image having a high resolution with a small number of pixels.

Although the first main sub-pixel SPXm1, the second main sub-pixel SPXm2, and the third main sub-pixel SPXm3 are arranged in a pentile matrix structure in FIGS. 8 and 9, the disclosure according to the invention is not limited thereto. In another embodiment, for example, the first main sub-pixel SPXm1, the second main sub-pixel SPXm2, and the third main sub-pixel SPXm3 may be arranged in any of various structures such as a stripe structure, a mosaic arrangement structure, or a delta arrangement structure.

Each of the plurality of auxiliary pixels PXa may include a first auxiliary sub-pixel SPXa1, a second auxiliary sub-pixel SPXa2, and a third auxiliary sub-pixel SPXa3. The first auxiliary sub-pixel SPXa1 that is a minimum unit for displaying an image may correspond to an emission area that emits light due to a display element. When an organic light-emitting diode is used as the display element, the emission area may be defined by an opening of a pixel-defining film. Although the first auxiliary sub-pixel SPXa1 is mainly described, the same description may apply to the second auxiliary sub-pixel SPXa2 and the third auxiliary sub-pixel SPXa3.

In an embodiment, the first auxiliary sub-pixel SPXa1 may be located to face the main display area MDA. The first auxiliary sub-pixel SPXa1 may be located closer to the main display area MDA than the second auxiliary sub-pixel SPXa2 and the third auxiliary sub-pixel SPXa3. The second auxiliary sub-pixel SPXa2 and the third auxiliary sub-pixel SPXa3 may be located away from the main display area MDA with respect to the first auxiliary sub-pixel SPXa1. The first auxiliary sub-pixel SPXa1 may be located to face a corner of the main display area MDA. The first auxiliary sub-pixel SPXa1 may be located closer to the corner of the main display area MDA than the second auxiliary sub-pixel SPXa2 and the third auxiliary sub-pixel SPXa3. The corner of the main display area MDA may correspond to a portion of the main display area MDA that is connected to the corner display area CDA. The corner of the main display area MDA may correspond to a portion of an edge of the main display area MDA that has a curvature. The corner of the main display area MDA may correspond to a curved or bent portion of an edge of the main display area MDA. For example, because a dashed line between the corner display area CDA and the main display area MDA of FIG. 8 has a curvature and corresponds to a portion where the main display area MDA and the corner display area CDA are connected to each other, the dashed line may correspond to the corner of the main display area MDA. Also, a portion of the main display area MDA adjacent to the dashed line may also correspond to the corner of the main display area MDA.

In this case, the first auxiliary sub-pixel SPXa1 may emit light of the same wavelength band as that of main sub-pixels whose number per unit area is the largest from among the first main sub-pixels SPXm1, the second main sub-pixels SPXm2, and the third main sub-pixels SPXm3 located in the main display area MDA.

In an embodiment, for example, the number of the first main sub-pixels SPXm1 per unit area included in the main pixel PXm may be greater than each of the number of the second main sub-pixels SPXm2 per unit area and the number of the third main sub-pixels SPXm3 per unit area as in the above example. One main pixel PXm may include two first main sub-pixels SPXm1, and the number of the first main sub-pixels SPXm1 per unit area in the main display area MDA may be greater than each of the number of the second main sub-pixels SPXm2 per unit area and the number of the third main sub-pixels SPXm3 per unit area. In this case, the first auxiliary sub-pixel SPXa1 located closest to the main display area MDA may emit light of the same first wavelength band as that of the first main sub-pixel SPXm1. For example, the first wavelength may range from about 490 nm to about 570 nm.

As in an embodiment, the first auxiliary sub-pixel SPXa1 that emits light of the same first wavelength band as that of the first main sub-pixel SPXm1 whose number per unit area in the main display area MDA is the largest may be located closer to the main display area MDA than the second auxiliary sub-pixel SPXa2 and the third auxiliary sub-pixel SPXa3.

When the first auxiliary sub-pixel SPXa1 is located close to the main display area MDA, a gap gp between the corner display area CDA in which the plurality of auxiliary pixels PXa are located and the main display area MDA in which the plurality of main pixels PXm are located may be reduced. In detail, a gap gp between a portion of the corner display area CDA in which the plurality of auxiliary pixels PXa are located and a portion of the main display area MDA in which the plurality of main pixels PXm are located may be reduced. That is, the gap gp between the auxiliary pixel PXa located in the corner display area CDA and the main pixel PXm located in the corner of the main display area MDA may be reduced. The gap gp may be a separation distance between an auxiliary sub-pixel and a main sub-pixel that are located in the corner display area CDA and the corner of the main display area MDA, respectively, and emit light of the same wavelength band.

In an embodiment, for example, as shown in FIG. 9, the gap gp may be a separation distance between a long side s11 (i.e., longitudinal side) of the first auxiliary sub-pixel SPXa1 located in the corner display area CDA and facing the main display area MDA and the first main sub-pixel SPXm1 located in the corner of the main display area MDA. In this case, the first auxiliary sub-pixel SPXa1 may be located closest to the corner of the main display area MDA from among auxiliary sub-pixels, and the first main sub-pixel SPXm1 may be located closest to the corner display area CDA from among main sub-pixels. The separation distance may correspond to a vertical distance between the long side s11 of the first auxiliary sub-pixel SPXa1 facing the main display area MDA and a virtual line parallel to the long side s11 of the first auxiliary sub-pixel SPXa1 and contacting an end of the first main sub-pixel SPXm1 closest to the corner display area CDA. A virtual line perpendicular to the long side s11 of the first auxiliary sub-pixel SPXa1 located closest to the corner of the main display area MDA may meet the first main sub-pixel SPXm1 located closest to the corner display area CDA. In this case, the gap gp may correspond to a length of the virtual line. As used herein, the "vertical distance" means a distance between a first line and a second line that are parallel to each other in a direction perpendicular to the first line. In a case between a first line and an object, the vertical distance between the first line and the object means the virtual distance between the first line and a virtual line, where the virtual line is the closest virtual line to the first line from among virtual lines parallel to the first line and crossing or touching the object.

When the first auxiliary sub-pixel SPXa1 is located closer to the main display area MDA, the gap gp may be more reduced than that when the second auxiliary sub-pixel SPXa2 or the third auxiliary sub-pixel SPXa3 is located closer to the main display area MDA. For example, the gap gp when the first auxiliary sub-pixel SPXa1 is located closer to the main display area MDA may be about 0.5 to about 0.8 times a gap when the second auxiliary sub-pixel SPXa2 or the third auxiliary sub-pixel SPXa3 is located closer to the main display area MDA.

When an intermediate layer (also referred to as an emission layer) corresponding to each of the first main sub-pixel SPXm1, the second main sub-pixel SPXm2, the third main sub-pixel SPXm3, the first auxiliary sub-pixel SPXa1, the second auxiliary sub-pixel SPXa2, and the third auxiliary sub-pixel SPXa3 is formed, sub-pixels emitting light of the same wavelength band may use the same fine metal mask (FMM). For example, the first main sub-pixel SPXm1 and the first auxiliary sub-pixel SPXa1 may emit light of a first wavelength band, the second main sub-pixel SPXm2 and the second auxiliary sub-pixel SPXa2 may emit light of a second wavelength band, and the third main sub-pixel SPXm3 and the third auxiliary sub-pixel SPXa3 may emit light of a third wavelength band. In this case, because intermediate layers corresponding to sub-pixels emitting light of the same wavelength may be formed by using the same fine metal mask, three fine metal masks may be used in total.

A thickness of each fine metal mask may vary according to the number of the first main sub-pixels SPXm1, the second main sub-pixels SPXm2, and the third main sub-pixels SPXm3 per unit area. Because the number of openings defined in the fine metal mask increases as the number of main sub-pixels per unit area increases, a more elaborate work is required. Because a more elaborate work may be performed as a thickness of a fine metal mask decreases, a thickness of a fine metal mask may decrease as the number of main sub-pixels per unit area increases. According to the above embodiment, because the number of the first main sub-pixels SPXm1 per unit area in the main display area MDA is the largest among the numbers of the main sub-pixels per unit area, a fine metal mask for forming an intermediate layer corresponding to the first main sub-pixel SPXm1 may be the thinnest. Accordingly, an intermediate layer corresponding to the first auxiliary sub-pixel SPXa1 that emits light of the same first wavelength band as that of the first main sub-pixel SPXm1 may also be formed by using a thinnest fine metal mask.

Because a more precise process may be performed as a thickness of a fine metal mask decreases, a gap gp between openings for forming intermediate layers that emit light of the first wavelength band may be more narrowly formed. Accordingly, a gap gp between an opening for forming an intermediate layer corresponding to the first main sub-pixel SPXm1 and an opening for forming an intermediate layer corresponding to the first auxiliary sub-pixel SPXa1 may be reduced. As a result, a gap gp between the first main sub-pixel SPXm1 located in the corner of the main display area MDA and the first auxiliary sub-pixel SPXa1 located in the corner display area CDA may be reduced. Therefore, a gap gp between the corner of the main display area MDA and the corner display area CDA may be reduced.

Shapes and arrangements of the main pixels PXm located in the main display area MDA and the auxiliary pixels PXa located in the corner display area CDA may be different. Due to the different shapes and arrangements of the pixels, a boundary line (e.g., a dark line) may be visible at a boundary between two areas. However, when a thin fine metal mask is used as described above, a gap gp between two areas may be reduced, and a boundary line (e.g., a dark line) due to shapes and arrangements of pixels may not be visible due to the reduced gap gp.

In an embodiment, a shape of each of the first auxiliary sub-pixel SPXa1, the second auxiliary sub-pixel SPXa2, and the third auxiliary sub-pixel SPXa3 may be a rectangular shape in a plan view. Although not shown in FIGS. 8 and 9, each of the first auxiliary sub-pixel SPXa1, the second auxiliary sub-pixel SPXa2, and the third auxiliary sub-pixel SPXa3 may have a curved corner. Each of the first auxiliary sub-pixel SPXa1, the second auxiliary sub-pixel SPXa2, and the third auxiliary sub-pixel SPXa3 may have a rounded corner. Each of the first auxiliary sub-pixel SPXa1, the second auxiliary sub-pixel SPXa2, and the third auxiliary sub-pixel SPXa3 may have a rounded rectangular planar shape.

In an embodiment, the first auxiliary sub-pixel SPXa1 may be located to face the main display area MDA. In detail, the long side s11 (i.e., longitudinal side) of the first auxiliary sub-pixel SPXa1 may face the main display area MDA. In this case, a direction of the long side s11 of the first auxiliary sub-pixel SPXa1 may vary according to a location of the first auxiliary sub-pixel SPXa1.

In an embodiment, for example, as shown in FIG. 8, a direction of the long side s11 of the first auxiliary sub-pixel SPXa1 may vary according to a contour of the corner of the main display area MDA. A direction of the long side s11 of the first auxiliary sub-pixel SPXa1 may gradually vary from the first direction (e.g., the y direction) to the second direction (e.g., the x direction) along the second direction. As a distance between the first auxiliary sub-pixel SPXa1 and approximately the center of the main display area MDA in the second direction (e.g., the x direction) decreases, a direction of the long side s11 of the first auxiliary sub-pixel SPXa1 may be closer to the second direction (e.g., the x direction). That is, as a distance between the first auxiliary sub-pixel SPXa1 and a virtual line, which passes through approximately the center of the main display area MDA and extends in the first direction (e.g., the y direction), in the second direction (e.g., the x direction) decreases, a direction of the long side s11 of the first auxiliary sub-pixel SPXa1 may be closer to the second direction (e.g., the x direction). In contrast, as a distance between the first auxiliary sub-pixel SPXa1 and approximately the center of the main display area MDA in the second direction (e.g., the x direction) increases, a direction of the long side s11 of the first auxiliary sub-pixel SPXa1 may be closer to the first direction (e.g., the y direction). That is, as a distance between the first auxiliary sub-pixel SPXa1 and a virtual line, which passes through approximately the center of the main display area MDA and extends in the first direction (e.g., y direction), in the second direction (e.g., the x direction) increases, a direction of the long side s11 of the first auxiliary sub-pixel SPXa1 may be closer to the first direction (e.g., the y direction).

When a direction of the long side s11 of the first auxiliary sub-pixel SPXa1 is closer to the second direction (e.g., the x direction), it may mean that an angle between the long side s11 of the first auxiliary sub-pixel SPXa1 and a virtual line extending in the second direction (e.g., the x direction) decreases. That is, when a direction of the long side s11 of the first auxiliary sub-pixel SPXa1 is closer to the first direction (e.g., the y direction), it may mean that an angle between the long side s11 of the first auxiliary sub-pixel SPXa1 and a virtual line extending in the first direction (e.g., the y direction) decreases. In this case, the angle between the long side s11 of the first auxiliary sub-pixel SPXa1 and the virtual line extending in the second direction (e.g., the x direction) may range from about 0 degrees)(° to about 90°. The angle between the long side s11 of the first auxiliary sub-pixel SPXa1 and the virtual line extending in the first direction (e.g., the y direction) may range from about 0° to about 90°.

Referring to FIG. 9, the first auxiliary sub-pixels SPXa1 located at different locations may be compared. A distance of the first auxiliary sub-pixel SPXa1 of the first auxiliary pixel PXa1 from approximately the center of the main display area MDA in the second direction (e.g., the x direction) may be greater than that of the first auxiliary sub-pixel SPXa1 of the second auxiliary pixel PXa2. In this case, an angle between the first direction (e.g., they direction) and a direction of a long side s11a of the first auxiliary sub-pixel SPXa1 of the first auxiliary pixel PXa1 may be θ1, and an angle between the first direction (e.g., the y direction) and a direction of a long side s11b of the first auxiliary sub-pixel SPXa1 of the second auxiliary pixel PXa2 may be θ2. In this case, θ1 may be less than θ2. That is, a direction of the long side s11a of the first auxiliary sub-pixel SPXa1 of the first auxiliary pixel PXa1 may be closer to the first direction (e.g., the y direction) than a direction of the long side s11b of the first auxiliary sub-pixel SPXa1 of the second auxiliary pixel PXa2.

Referring to FIG. 8, an angle between the first direction (e.g., the y direction) and a direction of the long side s11 of the first auxiliary sub-pixel SPXa1 that is located farthest in the −x direction from approximately the center of the main display area MDA may be θ3. An angle between the first direction (e.g., the y direction) and a direction of the long side s11 of the first auxiliary sub-pixel SPXa1 that is located closest in the −x direction to approximately the center of the main display area MDA may be θ4. In this case, θ3 may be less than θ4. That is, as a distance in the −x direction from approximately the center of the main display area MDA increases, a direction of the long side s11 of the first auxiliary sub-pixel SPXa1 may be closer to the first direction (e.g., the y direction). Although a lower left corner portion of the display panel 10 of FIG. 3 is mainly described in FIGS. 8 and 9, the same description may apply to upper left, lower right, and upper right corner portions of the display panel 10. For example, in the case of the lower right corner portion of the display panel 10, as a distance in the +x direction from approximately the center of the main display area MDA increases, a direction of the long side s11 of the first auxiliary sub-pixel SPXa1 may be closer to the first direction (e.g., the y direction), unlike the lower left corner portion of the display panel 10.

In an embodiment, a long side s21 (i.e., longitudinal side) of the second auxiliary sub-pixel SPXa2 and a long side s31 of the third auxiliary sub-pixel SPXa3 may face each other. Also, each of a short side s22 (i.e., latitudinal side) of the second auxiliary sub-pixel SPXa2 and a short side s32 of the third auxiliary sub-pixel SPXa3 may face the long side s11 of the first auxiliary sub-pixel SPXa1. The first auxiliary sub-pixel SPXa1, the second auxiliary sub-pixel SPXa2, and the third auxiliary sub-pixel SPXa3 may be arranged in an s-stripe structure.

In this case, a vertical distance d1 between the short side s22 of the second auxiliary sub-pixel SPXa2 and the long side s11 of the first auxiliary sub-pixel SPXa1 may be the same as a vertical distance d2 between the short side s32 of the third auxiliary sub-pixel SPXa3 and the long side s11 of the first auxiliary sub-pixel SPXa1.

Also, a length l1 of the long side s11 of the first auxiliary sub-pixel SPXa1 may be greater than a sum of a length l2 of the short side s22 of the second auxiliary sub-pixel SPXa2 and a length l3 of the short side s32 of the third auxiliary sub-pixel SPXa3.

In an embodiment, the first auxiliary sub-pixel SPXa1 may be located closer to the main display area MDA than the second auxiliary sub-pixel SPXa2 and the third auxiliary sub-pixel SPXa3. The long side s21 of the second auxiliary sub-pixel SPXa2 and the long side s31 of the third auxiliary sub-pixel SPXa3 may extend in a direction from the main display area MDA to the corner display area CDA. The second auxiliary sub-pixel SPXa2 and the third auxiliary sub-pixel SPXa3 may be located away from the main display area MDA with respect to the first auxiliary sub-pixel SPXa1.

In an embodiment, for example, as shown in FIG. 9, a vertical distance vd1 between the long side s11 of the first auxiliary sub-pixel SPXa1 and an arbitrary main sub-pixel located in the main display area MDA may be less than a vertical distance vd2 between the short side s22 of the second auxiliary sub-pixel SPXa2 and the arbitrary main sub-pixel. The vertical distance vd1 between the long side s11 of the first auxiliary sub-pixel SPXa1 and the arbitrary main sub-pixel located in the main display area MDA may be less than a vertical distance vd3 between the short side s32 of the third auxiliary sub-pixel SPXa3 and the arbitrary main sub-pixel.

Referring to FIGS. 8 and 9, a resolution of the main display area MDA may be higher than a resolution of the corner display area CDA. The number of the plurality of main pixels PXm per unit area located in the main display area MDA may be greater than the number of the plurality of auxiliary pixels PXa per unit area located in the corner display area CDA.

In this case, in order to make a luminance of the main display area MDA similar to a luminance of the corner display area CDA, a size of the first auxiliary sub-pixel SPXa1 located in the corner display area CDA may be greater than a size of the first main sub-pixel SPXm1 located in the main display area MDA. Although the first auxiliary sub-pixel SPXa1 and the first main sub-pixel SPXm1 are mainly described, the same description may apply to the second auxiliary sub-pixel SPXa2 and the second main sub-pixel SPXm2, and the third auxiliary sub-pixel SPXa3 and the third main sub-pixel SPXm3.

Figure 10:
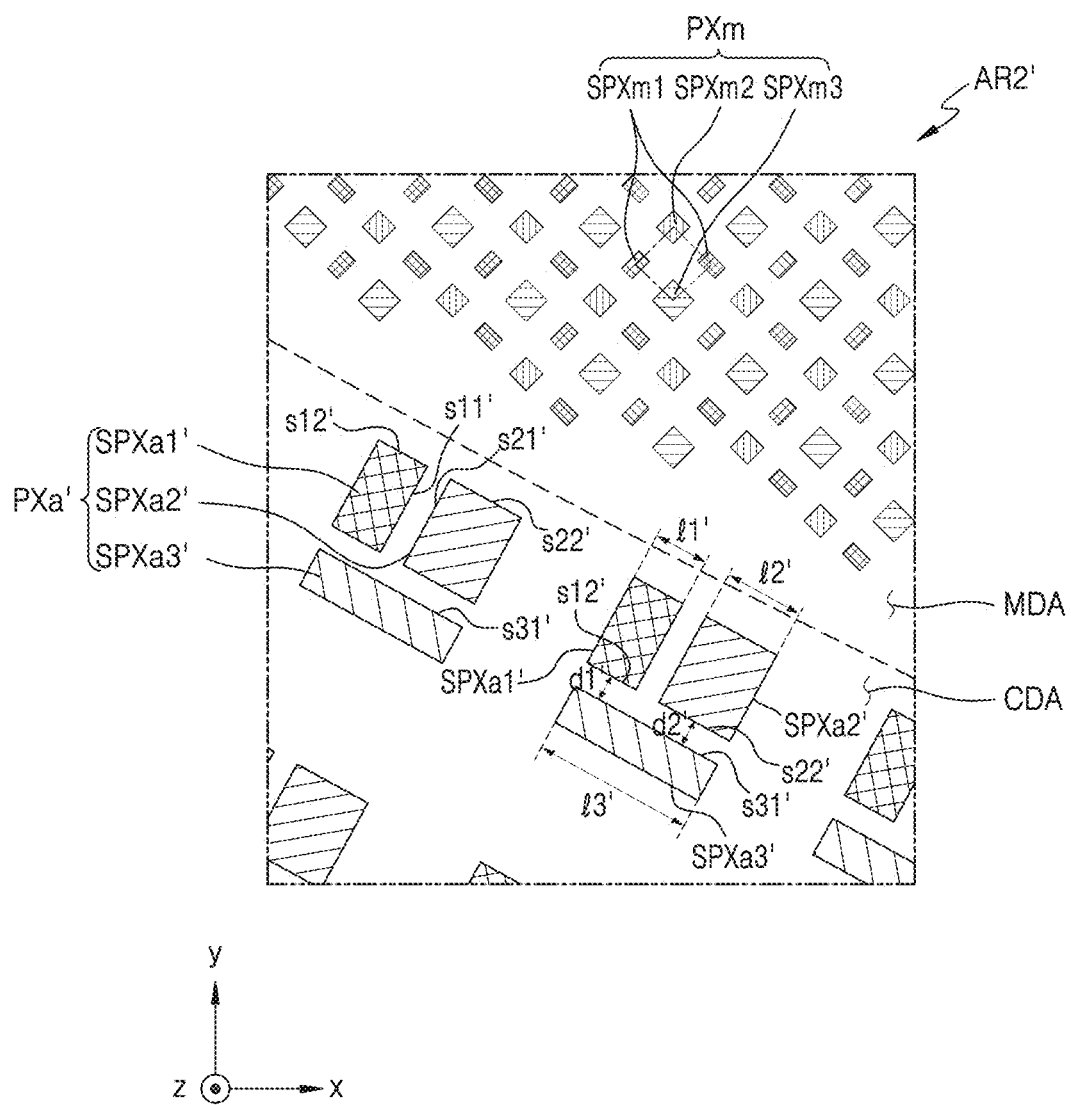
FIG. 10 is an enlarged plan view illustrating a portion of FIG. 8.

FIG. 10 is an enlarged plan view illustrating a portion of FIG. 8. In detail, FIG. 10 corresponds to a modification of FIG. 9 (in this aspect, the portion shown in FIG. 10 is marked as AR2' compared to the portion AR2 in FIG. 9), and structures of auxiliary sub-pixels located in a corner display area are different. Accordingly, the structures of the auxiliary sub-pixels located in the corner display area CDA will now be described.

Referring to FIG. 10, an auxiliary pixel PXa' located in the corner display area CDA may include a first auxiliary sub-pixel SPXa1', a second auxiliary sub-pixel SPXa2', and a third auxiliary sub-pixel SPXa3'. The first auxiliary sub-pixel SPXa1' that is a minimum unit for displaying an image may correspond to an emission area that emits light due to a display element. When an organic light-emitting diode is used as the display element, the emission area may be defined by an opening of a pixel-defining film. Although the first auxiliary sub-pixel SPXa1' is mainly described, the same description may apply to the second auxiliary sub-pixel SPXa2' and the third auxiliary sub-pixel SPXa3'.

In an embodiment, the first auxiliary sub-pixel SPXa1' may be located to face the main display area MDA. In detail, a short side s12' (i.e., latitudinal side) of the first auxiliary sub-pixel SPXa1' may face the main display area MDA. In this case, a direction of the short side s12' of the first auxiliary sub-pixel SPXa1' may vary according to a location of the first auxiliary sub-pixel SPXa1'.

In an embodiment, for example, as shown in FIG. 10, a direction of the short side s12' of the first auxiliary sub-pixel SPXa1' may vary according to a corner of the main display area MDA. A direction of the short side s12' of the first auxiliary sub-pixel SPXa1' may gradually vary from the first direction (e.g., the y direction) to the second direction (e.g., the x direction).

In an embodiment, a long side s11' (i.e., longitudinal side) of the first auxiliary sub-pixel SPXa1' and a long side s21' of the second auxiliary sub-pixel SPXa2' may face each other. Also, the short side s12' of the first auxiliary sub-pixel SPXa1' and a short side s22' of the second auxiliary sub-pixel SPXa2' may face a long side s31' of the third auxiliary sub-pixel SPXa3'. The first auxiliary sub-pixel SPXa1', the second auxiliary sub-pixel SPXa2', and the third auxiliary sub-pixel SPXa3' may be arranged in an s-stripe structure.

The first auxiliary sub-pixel SPXa1', the second auxiliary sub-pixel SPXa2', and the third auxiliary sub-pixel SPXa3' may have the same structure as that obtained by inverting the auxiliary pixel PXa of FIG. 8 with the long side s11 of the first auxiliary sub-pixel SPXa1 as a rotational axis.

In this case, a vertical distance d1' between the short side s12' of the first auxiliary sub-pixel SPXa1' and the long side s31' of the third auxiliary sub-pixel SPXa3' may be the same as a vertical distance d2' between the short side s22' of the second auxiliary sub-pixel SPXa2' and the long side s31' of the third auxiliary sub-pixel SPXa3'.

A length l1' of the short side s12' of the first auxiliary sub-pixel SPXa1' may be less than a difference between a length a l3' of the long side s31' of the third auxiliary sub-pixel SPXa3' and a length l2' of the short side s22' of the second auxiliary sub-pixel SPXa2'.

In an embodiment, the first auxiliary sub-pixel SPXa1' and the second auxiliary sub-pixel SPXa2' may be located closer to the main display area MDA than the third auxiliary sub-pixel SPXa3'. In this case, each of the first auxiliary sub-pixel SPXa1' and the second auxiliary sub-pixel SPXa2' may emit light of the same color as that of main sub-pixels whose number per unit area in the main display area MDA is large. The number of the main sub-pixels whose number per unit area in the main display area MDA is large may be equal to or greater than 2.

In an embodiment, for example, when main sub-pixels whose number per unit area in the main display area MDA is large emit red light and blue light, respectively, the first auxiliary sub-pixel SPXa1' may emit red light and the second auxiliary sub-pixel SPXa2' may emit blue light. In contrast, the first auxiliary sub-pixel SPXa1' may emit blue light, and the second auxiliary sub-pixel SPXa2' may emit red light. This is merely an example, and colors of light emitted by the first auxiliary sub-pixel SPXa1' and the second auxiliary sub-pixel SPXA2' may vary according to colors of light emitted by the main sub-pixels.

Figure 11:
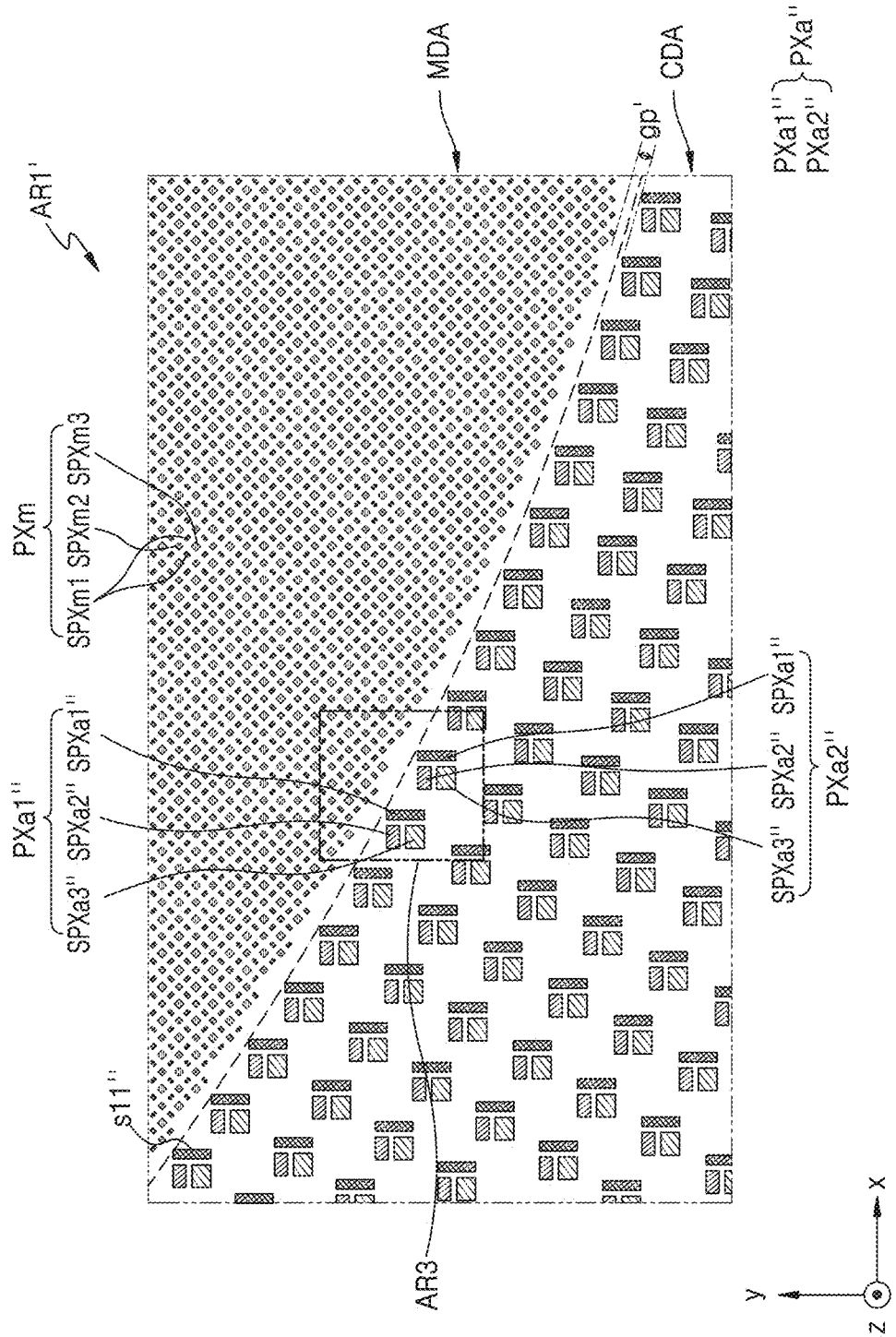
FIG. 11 is an enlarged plan view illustrating a main display area and a corner display area of FIG. 3.
Figure 12:
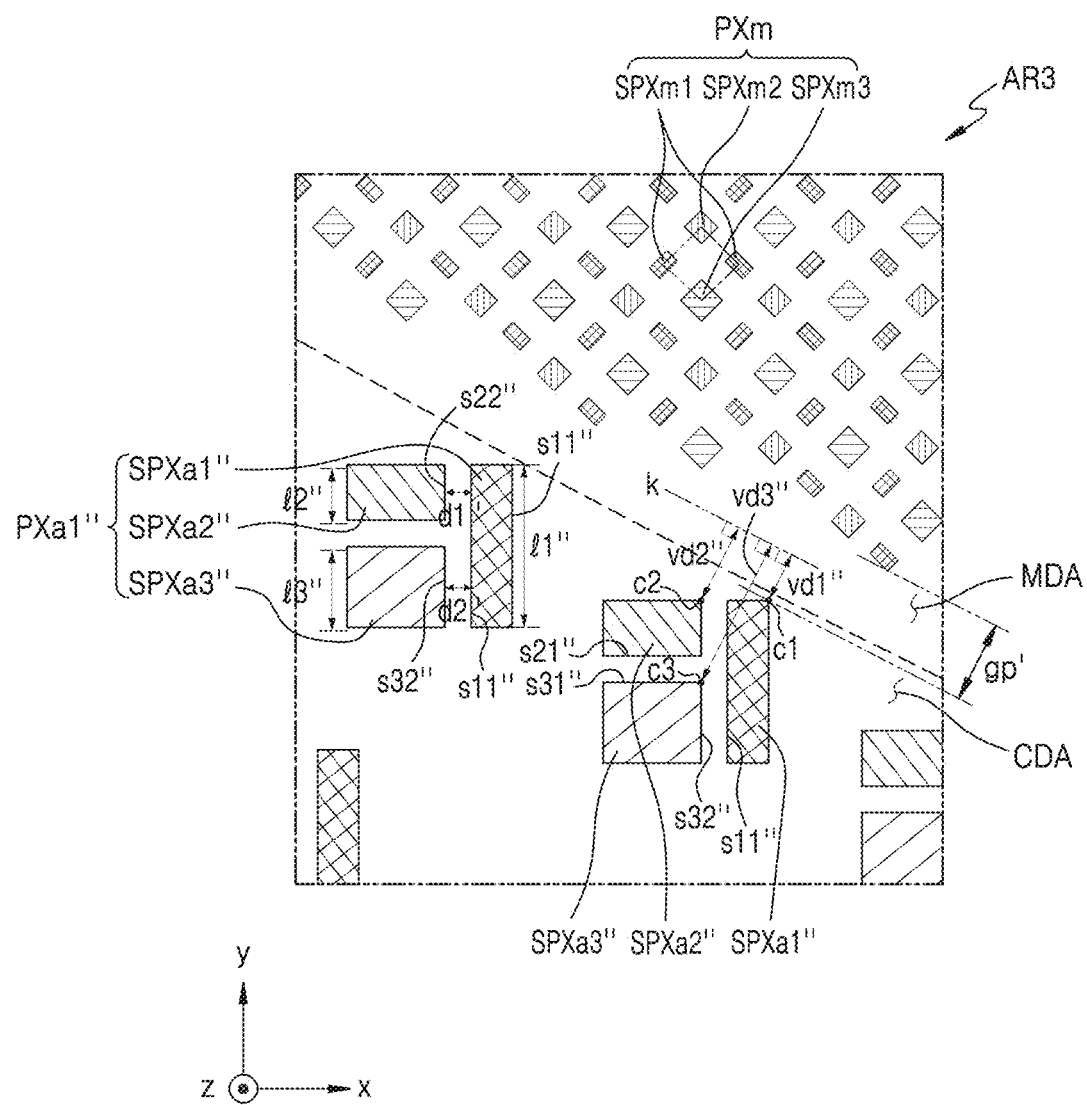
FIG. 12 is an enlarged plan view illustrating a portion of FIG. 11.

FIG. 11 is an enlarged plan view illustrating a main display area and a corner display area of FIG. 3. FIG. 12 is an enlarged plan view illustrating a portion of FIG. 11. In detail, FIGS. 11 and 12 correspond to a modification of FIGS. 8 and 9, and structures of auxiliary sub-pixels located in a corner display area are different. Accordingly, the structures of the auxiliary sub-pixels located in the corner display area will now be described. In this aspect, the portion shown in FIG. 11 is marked as AR1' compared to the portion AR1 in FIG. 8, and the portion shown in FIG. 12 is marked as AR3 compared to the portion AR3 in FIG. 9.

Referring to FIG. 11, an auxiliary pixel PXa" located in the corner display area CDA may include a first auxiliary sub-pixel SPXa1", a second auxiliary sub-pixel SPXa2", and a third auxiliary sub-pixel SPXa3". The first auxiliary sub-pixel SPXa1" that is a minimum unit for displaying an image may correspond to an emission area that emits light due to a display element. When an organic light-emitting diode is used as the display element, the emission area may be defined by an opening of a pixel-defining film. Although the first auxiliary sub-pixel SPXA1" is mainly described, the same description may apply to the second auxiliary sub-pixel SPXa2" and the third auxiliary sub-pixel SPXa3".

In an embodiment, the first auxiliary sub-pixel SPXa1" may be located to face the main display area MDA. The first auxiliary sub-pixel SPXa1" may be located closer to the main display area MDA than the second auxiliary sub-pixel SPXa2" and the third auxiliary sub-pixel SPXa3". The second auxiliary sub-pixel SPXa2" and the third auxiliary sub-pixel SPXa3" may be located in a direction (e.g., the −x direction) away from the main display area MDA with respect to the first auxiliary sub-pixel SPXa1".

In this case, the first auxiliary sub-pixel SPXa1" may emit light of the same wavelength band as that of main sub-pixels whose number per unit area is the largest from among the first main sub-pixels SPXm1, the second main sub-pixels SPXm2, and the third main sub-pixels SPXm3 located in the main display area MDA.

In an embodiment, for example, as described with reference to FIG. 9, the number of the first main sub-pixels SPXm1 included in the main pixel PXm may be greater than each of the number of the second main sub-pixels SPXm2 and the number of the third main sub-pixels SPXm3. The main pixel PXm may include two first main sub-pixels SPXm1, and the number of the first main sub-pixels SPXm1 per unit area in the main display area MDA may be greater than each of the number of the second main sub-pixels SPXm2 per unit area and the number of the third main sub-pixels SPXm3 per unit area. In this case, the first auxiliary sub-pixel SPXa1" located closest to the main display area MDA may emit light of the same first wavelength band as that of the first main sub-pixel SPXm1. For example, the first wavelength may range from about 490 nm to about 570 nm.

As in an embodiment, the first auxiliary sub-pixel SPXa1" that emits light of the same first wavelength band as that of the first main sub-pixel SPXm1 whose number per unit area in the main display area MDA is the largest may be located closer to the main display area MDA than the second auxiliary sub-pixel SPXa2" and the third auxiliary sub-pixel SPXa3".

When the first auxiliary sub-pixel SPXa1" is located close to the main display area MDA, a gap gp' between the corner display area CDA in which the plurality of auxiliary pixels PXa" are located and the main display area MDA in which the plurality of main pixels PXm are located may be reduced. In detail, the gap gp' between the auxiliary pixel PXa" located in the corner display area CDA and the main pixel PXm located in a corner of the main display area MDA may be reduced. The gap gp' may be a separation distance between an auxiliary sub-pixel and a main sub-pixel that are located in the corner display area CDA and the corner of the main display area MDA, respectively, and emit light of the same wavelength band. As shown in FIG. 12, the gap gp' may be a vertical distance between the first auxiliary sub-pixel SPXa1" closest to the main display area MDA and the first main sub-pixel SPXm1 closest to the corner display area CDA.

When the first auxiliary sub-pixel SPXa1" is located close to the main display area MDA, the gap gp' may be more reduced than that when the second auxiliary sub-pixel SPXa2" or the third auxiliary sub-pixel SPXa3" is located close to the main display area MDA.

The reason why the gap gp' between the auxiliary pixel PXa" located in the corner display area CDA and the main pixel PXm located in the corner of the main display area MDA is reduced may be that a fine metal mask having a smallest thickness may be used as described with reference to FIGS. 8 and 9. When the gap gp' between the auxiliary pixel PXa" located in the corner display area CDA and the main pixel PXm located in the corner of the main display area MDA is reduced, a boundary line (e.g., a dark line) due to shapes and arrangements of pixels may not be visible between the corner display area CDA and the main display area MDA.

In an embodiment, a shape of each of the first auxiliary sub-pixel SPXa1", the second auxiliary sub-pixel SPXa2", and the third auxiliary sub-pixel SPXa3" may be a rectangular shape in a plan view. Although not shown in FIGS. 11 and 12, each of the first auxiliary sub-pixel SPXa1", the second auxiliary sub-pixel SPXa2", and the third auxiliary sub-pixel SPXa3" may have a curved corner. Each of the first auxiliary sub-pixel SPXa1", the second auxiliary sub-pixel SPXa2", and the third auxiliary sub-pixel SPXa3" may have a rounded corner. Each of the first auxiliary sub-pixel SPXa1", the second auxiliary sub-pixel SPXa2", and the third auxiliary sub-pixel SPXa3" may have a rounded rectangular planar shape.

In an embodiment, the first auxiliary sub-pixel SPXa1" may be located to face the main display area MDA. In detail, a long side s11" of the first auxiliary sub-pixel SPXa1" may face the main display area MDA in the second direction (e.g., the x direction). In this case, a direction of the long side s11" of the first auxiliary sub-pixel SPXa1" may be the first direction (e.g., they direction).

In an embodiment, a long side s21" (i.e., longitudinal side) of the second auxiliary sub-pixel SPXa2" and a long side s31" of the third auxiliary sub-pixel SPXa3" may face each other. Also, each of a short side s22" (i.e., latitudinal side) of the second auxiliary sub-pixel SPXa2" and a short side s32" of the third auxiliary sub-pixel SPXa3" may face the long side s11" of the first auxiliary sub-pixel SPXa1". The first auxiliary sub-pixel SPXa1", the second auxiliary sub-pixel SPXa2", and the third auxiliary sub-pixel SPXa3" may be arranged in an s-stripe structure.

A vertical distance d1" between the short side s22" of the second auxiliary sub-pixel SPXa2" and the long side s11" of the first auxiliary sub-pixel SPXa1" may be the same as a vertical distance d2" between the short side s32" of the third auxiliary sub-pixel SPXa3" and the long side s11" of the first auxiliary sub-pixel SPXa1".

Also, a length $\ell 1$" of the long side s11" of the first auxiliary sub-pixel SPXa1" may be greater than a sum of a length $\ell 2$" of the short side s22" of the second auxiliary sub-pixel SPXa2" and a length $\ell 3$" of the short side s32" of the third auxiliary sub-pixel SPXa3".

In an embodiment, the first auxiliary sub-pixel SPXa1" may be located closer to the main display area MDA than the second auxiliary sub-pixel SPXa2" and the third auxiliary sub-pixel SPXa3". The second auxiliary sub-pixel SPXa2" and the third auxiliary sub-pixel SPXa3" may be located in a direction (e.g., the −x direction) away from the main display area MDA with respect to the first auxiliary sub-pixel SPXa1".

In an embodiment, for example, as shown in FIG. 12, locations of the first auxiliary sub-pixel SPXa1", the second auxiliary sub-pixel SPXa2", and the third auxiliary sub-pixel SPXa3" may be compared by using a virtual line k that extends in an arbitrary direction between the first direction (e.g., the y direction) and the second direction (e.g., the x direction). The virtual line k may be parallel to a tangent line contacting the corner of the main display area MDA.

The virtual line k may be located in second and fourth quadrants in the first direction (e.g., the y direction) and the second direction (e.g., the x direction). Because the corner display area CDA connected to a lower left corner of the main display area MDA is mainly described in FIG. 12, the virtual line k may be located in the second and fourth quadrants in the first direction (e.g., the y direction) and the second direction (e.g., the x direction). Accordingly, the virtual line k may also be located in first and third quadrants in the first direction (e.g., the y direction) and the second direction (e.g., the x direction) according to a location of the corner display area CDA.

A vertical distance vd1" between the virtual line k and a corner c1 facing the virtual line k from among corners of the first auxiliary sub-pixel SPXa1" may be less than a vertical distance vd2" between the virtual line k and a corner c2 of the second auxiliary sub-pixel SPXa2". The vertical distance vd1" between the virtual line k and the corner c1 facing the virtual line k from among the corners of the first auxiliary sub-pixel SPXa1" may be less than a vertical distance vd3" between the virtual line k and a corner c3 of the third auxiliary sub-pixel SPXa3".

Figure 13:
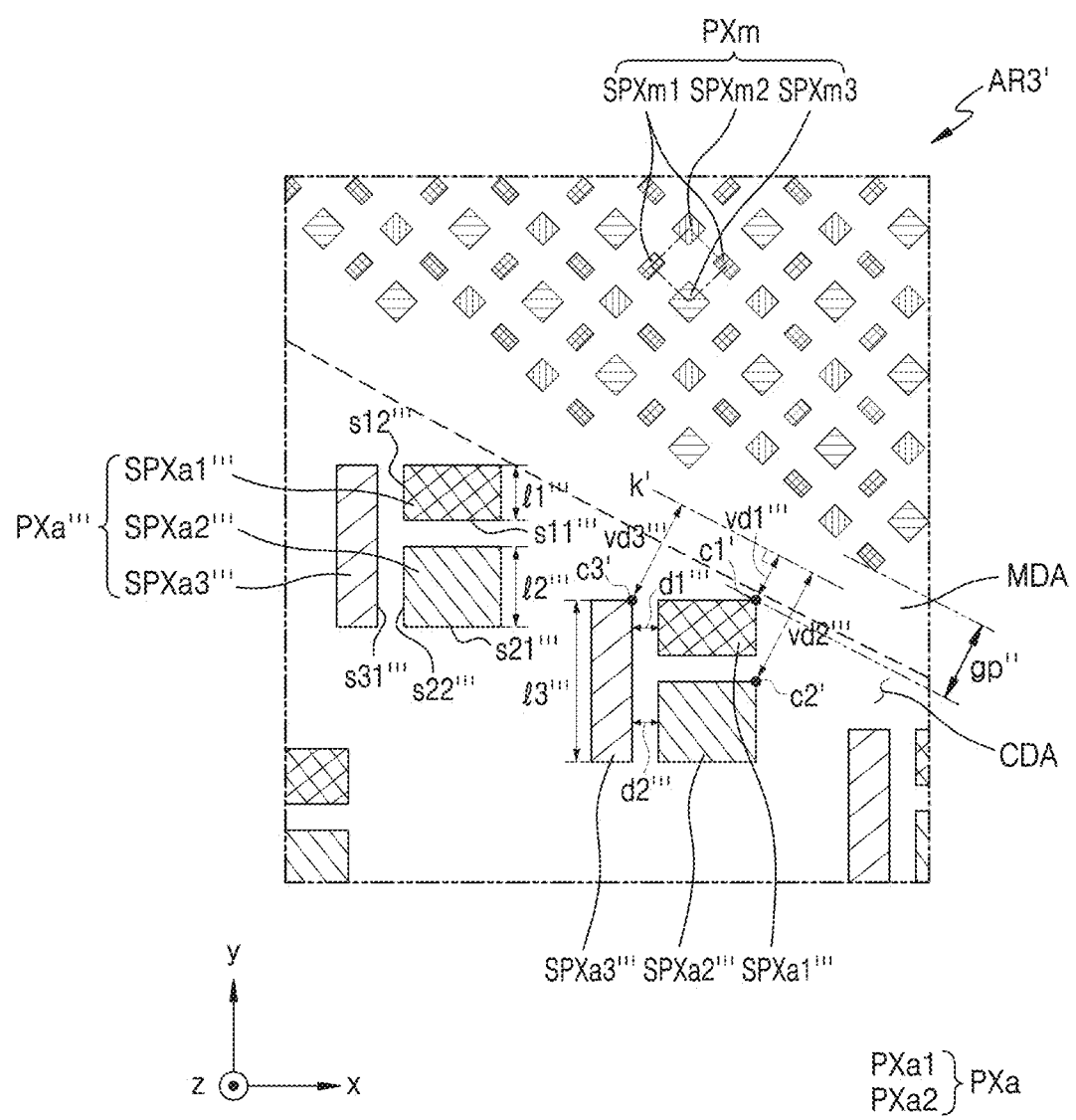
FIG. 13 is an enlarged plan view illustrating a portion of FIG. 11.

FIG. 13 is an enlarged plan view illustrating a portion of FIG. 11. In detail, FIG. 13 corresponds to a modification of FIG. 12, and structures of auxiliary sub-pixels located in a corner display area are different. In this aspect, the portion shown in FIG. 13 is marked as AR3' compared to the portion AR3 in FIG. 12. Accordingly, the structures of the auxiliary sub-pixels located in the corner display area will now be described.

Referring to FIG. 13, an auxiliary pixel PXa'" located in the corner display area CDA may include a first auxiliary sub-pixel SPXa1'", a second auxiliary sub-pixel SPXa2'", and a third auxiliary sub-pixel SPXa3'". The first auxiliary sub-pixel SPXa1'" that is a minimum unit for displaying an image may correspond to an emission area that emits light due to a display element. When an organic light-emitting diode is used as the display element, the emission area may be defined by an opening of a pixel-defining film. Although the first auxiliary sub-pixel SPXa1'" is mainly described, the same description may apply to the second auxiliary sub-pixel SPXa2'" and the third auxiliary sub-pixel SPXa3'".

In an embodiment, the first auxiliary sub-pixel SPXa1'" may be located to face the main display area MDA. The first auxiliary sub-pixel SPXa1'" may be located closer to the main display area MDA than the second auxiliary sub-pixel SPXa2'" and the third auxiliary sub-pixel SPXa3'". In this case, the first auxiliary sub-pixel SPXa1'" may emit light of the same wavelength band as that of main sub-pixels whose number per unit area is the largest from among the first main sub-pixels SPXm1, the second main sub-pixels SPXm2, and the third main sub-pixels SPXm3 located in the main display area MDA.

When the first auxiliary sub-pixel SPXa1'" that emits light of the same first wavelength band as that of the first main sub-pixel SPXm1 whose number per unit area in the main display area MDA is located close to the main display area MDA, a gap gp" between the corner display area CDA in which the plurality of auxiliary pixels PXa'" are located and the main display area MDA in which the plurality of main pixels PXm are located may be reduced. In detail, the gap gp" between the auxiliary pixel PXa'" located in the corner display area CDA and the main pixel PXm located in a corner of the main display area MDA may be reduced. The gap gp" may be a separation distance between an auxiliary sub-pixel and a main sub-pixel that are located in the corner display area CDA and the corner of the main display area MDA, respectively, and emit light of the same wavelength band. As shown in FIG. 13, the gap gp" may be a vertical distance between the first auxiliary sub-pixel SPXa1'" closest to the main display area MDA and the first main sub-pixel SPXm1 closest to the corner display area CDA.

The reason why the gap gp" between the auxiliary pixel PXa'" located in the corner display area CDA and the main pixel PXm located in the corner of the main display area MDA is reduced is that a fine metal mask having a smallest thickness may be used as described with reference to FIGS. 8 and 9. When the gap gp" between the auxiliary pixel PXa'" located in the corner display area CDA and the main pixel PXm located in the corner of the main display area MDA is reduced, a boundary line (e.g., a dark line) due to shapes and arrangements of pixels may not be visible between the corner display area CDA and the main display area MDA.

In an embodiment, a shape of each of the first auxiliary sub-pixel SPXa1''', the second auxiliary sub-pixel SPXa2''', and the third auxiliary sub-pixel SPXa3''' may be a rectangular shape in a plan view. Although not shown in FIG. 13, each of the first auxiliary sub-pixel SPXa1''', the second auxiliary sub-pixel SPXa2''', and the third auxiliary sub-pixel SPXa3''' may have a curved corner. Each of the first auxiliary sub-pixel SPXa1''', the second auxiliary sub-pixel SPXa2''', and the third auxiliary sub-pixel SPXa3''' may have a rounded corner. Each of the first auxiliary sub-pixel SPXa1''', the second auxiliary sub-pixel SPXa2''', and the third auxiliary sub-pixel SPXa3''' may have a rounded rectangular planar shape.

In an embodiment, the first auxiliary sub-pixel SPXa1''' may be located to face the main display area MDA. In detail, a short side s12''' (i.e., latitudinal side) of the first auxiliary sub-pixel SPXa1''' may face the main display area MDA in the second direction (e.g., the x direction). In this case, a direction of the short side s12''' of the first auxiliary sub-pixel SPXa1''' may be the first direction (e.g., the y direction).

In an embodiment, a long side s11''' (i.e., longitudinal side) of the first auxiliary sub-pixel SPXa1''' may face a long side s21''' of the second auxiliary sub-pixel SPXa2'''. Also, each of the short side s12''' of the first auxiliary sub-pixel SPXa1''' and a short side s22''' of the second auxiliary sub-pixel SPXa2''' may face a long side s31''' of the third auxiliary sub-pixel SPXa3'''. The first auxiliary sub-pixel SPXa1''', the second auxiliary sub-pixel SPXa2''', and the third auxiliary sub-pixel SPXa3''' may be arranged in an s-stripe structure. The first auxiliary sub-pixel SPXa1''', the second auxiliary sub-pixel SPXa2''', and the third auxiliary sub-pixel SPXa3''' may have the same structure as that obtained by inverting the auxiliary pixel PXa'' of FIG. 9 with the long side s11'' of the first auxiliary sub-pixel SPXa1'' as a rotational axis.

In this case, a vertical distance d1''' between the short side s12''' of the first auxiliary sub-pixel SPXa1''' and the long side s31''' of the third auxiliary sub-pixel SPXa3''' may be the same as a vertical distance d2''' between the short side s22''' of the second auxiliary sub-pixel SPXa2''' and the long side s31''' of the third auxiliary sub-pixel SPXa3'''. Also, a length $\ell 1'''$ of the short side s12''' of the first auxiliary sub-pixel SPXa1''' may be less than a difference between a length $\ell 3'''$ of the long side s31''' of the third auxiliary sub-pixel SPXa3''' and a length $\ell 2'''$ of the short side s22''' of the second auxiliary sub-pixel SPXa2'''.

In an embodiment, the first auxiliary sub-pixel SPXa1''' may be located closer to the main display area MDA than the second auxiliary sub-pixel SPXa2''' and the third auxiliary sub-pixel SPXa3'''.

In an embodiment, for example, as shown in FIG. 13, locations of the first auxiliary sub-pixels SPXa1''', the second auxiliary sub-pixels SPXa2''', and the third auxiliary sub-pixels SPXa3''' may be compared by using a virtual line k' that extends in an arbitrary direction between the first direction (e.g., the y direction) and the second direction (e.g., the x direction). The virtual line k' may be parallel to a tangent line contacting the corner of the main display area MDA.

The virtual line k' may be located in second and fourth quadrants in the first direction (e.g., the y direction) and the second direction (e.g., the x direction). Because the corner display area CDA connected to a lower left corner of the main display area MDA is mainly described in FIG. 11, the virtual line k' may be located in the second and fourth quadrants in the first direction (e.g., the y direction) and the second direction (e.g., the x direction). Accordingly, the virtual line k' may also be located in first and third quadrants in the first direction (e.g., the y direction) and the second direction (e.g., the x direction) according to a location of the corner display area CDA.

A vertical distance vd1''' between the virtual line k' and a corner c1' facing the virtual line k' from among corners of the first auxiliary sub-pixel SPXa1''' may be less than a vertical distance vd2''' between the virtual line k' and a corner c2' of the second auxiliary sub-pixel SPXa2'''. The vertical distance vd1''' between the virtual line k' and the corner c1' facing the virtual line k' from among the corners of the first auxiliary sub-pixel SPXa1''' may be less than a vertical distance vd3''' between the virtual line k' and a corner c3' of the third auxiliary sub-pixel SPXa3'''.

Figure 14A:
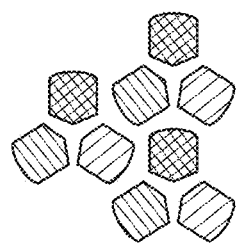
FIGS. 14A, 14B, and 14C are plan views illustrating auxiliary pixels according to an embodiment.
Figure 14B:
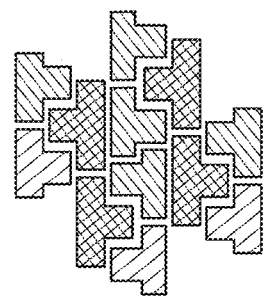
Figure 14C:
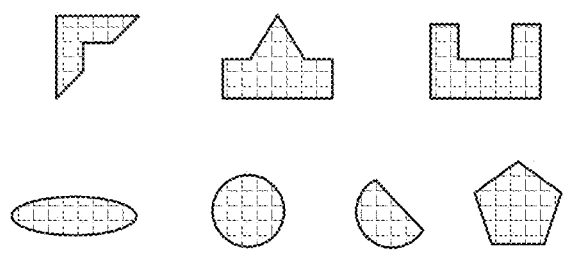

FIGS. 14A, 14B, and 14C are plan views illustrating auxiliary pixels according to an embodiment. In detail, FIGS. 14A, 14B, and 14C illustrate various shapes different from shapes of auxiliary pixels illustrated in FIGS. 8 through 13.

Referring to FIG. 14A, an auxiliary sub-pixel included in the auxiliary pixel PXa (see FIG. 8) located in the corner display area CDA (see FIG. 8) may have a fan-like planar shape. The auxiliary sub-pixel may have two straight lines that intersect each other and a curved line that connects both ends of the two straight lines.

In an embodiment, as shown in FIG. 14A, a triangle may be formed when the centers of a plurality of adjacent auxiliary sub-pixels are connected. Also, the plurality of adjacent auxiliary sub-pixels may be located so that straight lines included in the plurality of auxiliary sub-pixels face one another.

Referring to FIG. 14B, each of a plurality of auxiliary sub-pixels may have a planar shape having a convex portion. Some of the plurality of auxiliary sub-pixels may have a planar shape whose left portion is convex, and others may have a planar shape whose right portion is convex.

In an embodiment, as shown in FIG. 14B, convex portions of the plurality of auxiliary sub-pixels may be located adjacent to one another. In this case, an area where the auxiliary sub-pixels are not located may be reduced.

Shapes of a plurality of auxiliary sub-pixels according to the invention are not limited to those illustrated in FIGS. 14A and 14B, and may vary as shown in FIG. 14C. In another embodiment, for example, each of a plurality of auxiliary sub-pixels may have a polygonal planar shape such as a pentagonal shape, a heptagonal shape, or an octagonal shape. Alternatively, each of a plurality of auxiliary sub-pixels may have a planar shape such as a circular shape or a semi-circular shape.

Although a display panel and a display apparatus have been described, the disclosure according to the invention is not limited thereto. In another embodiment, for example, a method of manufacturing the display panel and a method of manufacturing the display apparatus may also be within the scope of the disclosure.

According to the one or more embodiments, there may be provided a display panel in which pixels located in a corner display area may be located adjacent to pixels located in a main display area and a luminance deviation and a color deviation between the main display area and the corner display area are reduced, and a display apparatus including the display panel. However, the disclosure according to the invention is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims.

What is claimed is:

1. A display panel comprising:
   a substrate comprising a main display area and a corner display area, wherein the main display area includes a flat portion and a curved corner in a plan view, and the corner display area is directly connected to the curved corner of the main display area and bent with a certain radius of curvature;
   a plurality of main pixels located in the main display area, each of the main pixels comprising at least one first main sub-pixel which emits light of a first wavelength band, at least one second main sub-pixel which emits light of a second wavelength band, and at least one third main sub-pixel which emits light of a third wavelength band;
   a plurality of auxiliary pixels located in the corner display area, each of the auxiliary pixels consisting of one first auxiliary sub-pixel, one second auxiliary sub-pixel, and one third auxiliary sub-pixel, wherein the auxiliary pixels are arranged repeatedly in the corner display area;
   a data line extending in a first direction and connected to the first main sub-pixel; and
   a gate line extending in a second direction and connected to the first main sub-pixel,
   wherein the second direction intersects the first direction,
   wherein each of the first auxiliary sub-pixel, the second auxiliary sub-pixel, and the third auxiliary sub-pixel has a rectangular shape in the plan view,
   wherein the first auxiliary sub-pixel is provided in plurality,
   wherein directions of long sides of the first auxiliary sub-pixels, the long sides facing the curved corner of the main display area, gradually vary from the first direction to the second direction according to a contour of the curved corner of the main display area,
   wherein number of the at least one first main sub-pixel included in each main pixel is greater than each of number of the at least one second main sub-pixel and number of the at least one third main sub-pixel included in each main pixel and greater than one,
   wherein the first auxiliary sub-pixel emits light of the first wavelength band,
   wherein sizes of the first to third auxiliary sub-pixels are greater than sizes of the first to third main sub-pixels, respectively, in the plan view,
   wherein, in an auxiliary pixel closest to the main display area among the plurality of auxiliary pixels, the first auxiliary sub-pixel that has a size greater than the first main sub-pixel is located closer to the main display area than the second auxiliary sub-pixel and the third auxiliary sub-pixel-.

2. The display panel of claim 1, wherein the first auxiliary sub-pixel is located to face the main display area.

3. The display panel of claim 1, wherein a short side of the second auxiliary sub-pixel and a short side of the third auxiliary sub-pixel faces the long side of the first auxiliary sub-pixel, respectively.

4. The display panel of claim 3, wherein a vertical distance between the short side of the second auxiliary sub-pixel and the long side of the first auxiliary sub-pixel is the same as a vertical distance between the short side of the third auxiliary sub-pixel and the long side of the first auxiliary sub-pixel.

5. The display panel of claim 3, wherein a length of the long side of the first auxiliary sub-pixel is greater than a sum of a length of the short side of the second auxiliary sub-pixel and a length of the short side of the third auxiliary sub-pixel.

6. The display panel of claim 3, wherein a vertical distance between the first main sub-pixel and the long side of the first auxiliary sub-pixel is less than each of a vertical distance between the first main sub-pixel and the short side of the second auxiliary sub-pixel and a vertical distance between the first main sub-pixel and the short side of the third auxiliary sub-pixel.

7. The display panel of claim 1, wherein the main pixel comprises two first main sub-pixels, one second main sub-pixel, and one third main sub-pixel,
   wherein a quadrangle is formed when centers of the first main sub-pixels, the second main sub-pixel, and the third main sub-pixel are connected.

8. The display panel of claim 7, wherein the first main sub-pixels are located in different columns, the second main sub-pixel is located in a column between the columns of the first main sub-pixels, and the second main sub-pixel and the third main sub-pixel are located in a same column.

9. The display panel of claim 1, wherein a resolution of the main display area is higher than a resolution of the corner display area.

10. The display panel of claim 1, wherein the first wavelength band ranges from about 490 nanometers (nm) to about 570 nm.

11. A display panel comprising:
    a substrate comprising a main display area and a corner display area, wherein the main display area includes a flat portion and a curved corner in a plan view, and the corner display area is directly connected to the curved corner of the main display area and bent with a certain radius of curvature;
    first to third main sub-pixels located in the main display area;
    a plurality of auxiliary pixels located in the corner display area, each of the auxiliary pixels consisting of one first auxiliary sub-pixel, one second auxiliary sub-pixel, and one third auxiliary sub-pixel each having a rectangular shape, wherein the auxiliary pixels are arranged repeatedly in the corner display area;
    a data line extending in a first direction and connected to the first main sub-pixel; and
    a gate line extending in a second direction and connected to the first main sub-pixel,
    wherein the second direction intersects the first direction,
    wherein each of the first auxiliary sub-pixel, the second auxiliary sub-pixel, and the third auxiliary sub-pixel has a rectangular shape in the plan view,
    wherein the first auxiliary sub-pixel is provided in plurality,
    wherein directions of long sides of the first auxiliary sub-pixels, the long sides facing the curved corner of the main display area, gradually vary from the first direction to the second direction according to a contour of the curved corner of the main display area, wherein a length of a long side of the first auxiliary sub-pixel is greater than a sum of a length of a short side of the second auxiliary sub-pixel and a length of a short side of the third auxiliary sub-pixel, wherein sizes of the first to third auxiliary sub-pixels are greater than sizes of the first to third main sub-pixels, respectively, in the plan view, wherein, in an auxiliary pixel closest to the main display area among the plurality of auxiliary pixels, the first auxiliary sub-pixel that has a size greater than the first main sub-pixel is located closer to the main display area than the second auxiliary sub-pixel and the third auxiliary sub-pixel.

12. The display panel of claim 11, wherein the first auxiliary sub-pixel is located closer to the main display area than the second auxiliary sub-pixel and the third auxiliary sub-pixel.

13. The display panel of claim 11, wherein a vertical distance between the short side of the second auxiliary sub-pixel and the long side of the first auxiliary sub-pixel is the same as a vertical distance between the short side of the third auxiliary sub-pixel and the long side of the first auxiliary sub-pixel.

14. The display panel of claim 11, wherein a vertical distance between the first main sub-pixel and the long side of the first auxiliary sub-pixel is less than each of a vertical distance between the first main sub-pixel and the short side of the second auxiliary sub-pixel and a vertical distance between the first main sub-pixel and the short side of the third auxiliary sub-pixel.

15. A display apparatus comprising:
a display panel comprising a substrate comprising a main display area including a flat portion and a corner display area, wherein the main display area further includes a curved corner in a plan view, and the corner display area directly extends from the curved corner of the main display area and is bent with a preset radius of curvature,
a plurality of main pixels located in the main display area, each of the main pixels comprising at least one first main sub-pixel which emits light of a first wavelength band, at least one second main sub-pixel which emits light of a second wavelength band, and at least one third main sub-pixel which emits light of a third wavelength band, and
a plurality of auxiliary pixels located in the corner display area, each of the auxiliary pixels consisting of one first auxiliary sub-pixel which emits light of the first wavelength band, one second auxiliary sub-pixel which emits light of the second wavelength band, and one third auxiliary sub-pixel which emits light of the third wavelength band;
a window covering the display panel;
a data line extending in a first direction and connected to the first main sub-pixel; and
a gate line extending in a second direction and connected to the first main sub-pixel,
wherein the second direction intersects the first direction,
wherein each of the first auxiliary sub-pixel, the second auxiliary sub-pixel, and the third auxiliary sub-pixel has a rectangular shape in the plan view,
wherein the first auxiliary sub-pixel is provided in plurality,
wherein directions of long sides of the first auxiliary sub-pixels, the long sides facing the curved corner of the main display area, gradually vary from the first direction to the second direction according to a contour of the curved corner of the main display area,
wherein the auxiliary pixels are arranged repeatedly in the corner display area,
wherein number of the at least one first main sub-pixel included in each main pixel is greater than each of number of the at least one second main sub-pixel and number of the at least one third main sub-pixel included in each main pixel and greater than one,
wherein sizes of the first to third auxiliary sub-pixels are greater than sizes of the first to third main sub-pixels, respectively, in the plan view,
wherein, in an auxiliary pixel closest to the main display area among the plurality of auxiliary pixels, the first auxiliary sub-pixel that has a size greater than the first main sub-pixel is located closer to the main display area than the second auxiliary sub-pixel and the third auxiliary sub-pixel.

16. The display apparatus of claim 15, wherein a short side of the second auxiliary sub-pixel and a short side of the third auxiliary sub-pixel faces the long side of the first auxiliary sub-pixel, respectively,
wherein a length of the long side of the first auxiliary sub-pixel is greater than a sum of a length of the short side of the second auxiliary sub-pixel and a length of the short side of the third auxiliary sub-pixel.

17. The display apparatus of claim 15, wherein a vertical distance between the first main sub-pixel and the long side of the first auxiliary sub-pixel is less than each of a vertical distance between the first main sub-pixel and a short side of the second auxiliary sub-pixel and a vertical distance between the first main sub-pixel and a short side of the third auxiliary sub-pixel.

* * * * *